US009974218B2

(12) United States Patent
Tanokuchi et al.

(10) Patent No.: US 9,974,218 B2
(45) Date of Patent: May 15, 2018

(54) COMPONENT SUPPLY DEVICE AND COMPONENT MOUNTING DEVICE

(71) Applicant: YAMAHA HATSUDOKI KABUSHIKI KAISHA, Shizuoka-ken (JP)

(72) Inventors: Akito Tanokuchi, Hitachi (JP); Tsutomu Yanagida, Kumagaya (JP); Kazuyoshi Ohyama, Kumagaya (JP); Yutaka Chida, Kumagaya (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 629 days.

(21) Appl. No.: 14/581,904

(22) Filed: Dec. 23, 2014

(65) Prior Publication Data
US 2015/0115093 A1 Apr. 30, 2015

Related U.S. Application Data

(63) Continuation of application No. PCT/JP2013/067280, filed on Jun. 24, 2013.

(30) Foreign Application Priority Data

Jun. 28, 2012 (JP) .................. 2012-144908

(51) Int. Cl.
H05K 13/02 (2006.01)
B65H 19/10 (2006.01)
(Continued)

(52) U.S. Cl.
CPC ............. H05K 13/02 (2013.01); B65H 19/10 (2013.01); B65H 19/12 (2013.01); B65H 20/02 (2013.01);
(Continued)

(58) Field of Classification Search
CPC ........ B65H 19/12; B65H 20/02; B65H 19/10; B65H 2402/5441; H05K 13/02; H05K 13/0417; H05K 13/021
See application file for complete search history.

(56) References Cited

U.S. PATENT DOCUMENTS 5,299,902 A * 4/1994 Fujiwara ............. H05K 13/021
221/25
6,887,330 B2 * 5/2005 Onoshiro ........... H05K 13/0417
156/159
(Continued)

FOREIGN PATENT DOCUMENTS

CN 101574025 A 11/2009
JP 02-165698 A 6/1990
(Continued)

OTHER PUBLICATIONS

The extended European search report issued by the European Patent Office dated Dec. 22, 2015, which corresponds to European Patent Application No. 13808524.6-1905 and is related to U.S. Appl. No. 14/581,904.
(Continued)

Primary Examiner — William A Rivera
(74) Attorney, Agent, or Firm — Studebaker & Brackett PC

(57) ABSTRACT

A component supply device loaded with a component supply tape for exposing and supplying an electronic component from the component supply tape with respect to a component mounting device mounting the electronic component on a substrate includes a replenishing unit performing replenishment of a new component supply tape when a preceding component supply tape is exhausted and a sensor senses exhaustion of the preceding component supply tape while a confluent portion where a channel for the preceding component supply tape and a channel for the new component
(Continued)

supply tape join with each other is formed between the sensor and the replenishing unit. A buckling prevention mechanism moves in response to an operation of the preceding component supply tape or the new component supply tape for preventing buckling when the new component supply tape is transported to the component supply device by the replenishing unit is arranged on the confluent portion.

20 Claims, 23 Drawing Sheets

(51) Int. Cl.
*H05K 13/04* (2006.01)
*B65H 20/02* (2006.01)
*B65H 19/12* (2006.01)

(52) U.S. Cl.
CPC ....... *H05K 13/021* (2013.01); *H05K 13/0417* (2013.01); *B65H 2402/5441* (2013.01)

(56) References Cited

U.S. PATENT DOCUMENTS

| | | | |
|---|---|---|---|
| 8,353,424 B2 | 1/2013 | Ikeda et al. | |
| 9,055,709 B2* | 6/2015 | Shin | B65H 37/002 |
| 2003/0219330 A1 | 11/2003 | Lyndaker et al. | |
| 2004/0094451 A1* | 5/2004 | Saho | B65H 19/1836 |
| | | | 206/714 |
| 2008/0093375 A1 | 4/2008 | Davis et al. | |
| 2010/0097461 A1 | 4/2010 | Utsumi et al. | |
| 2010/0180435 A1 | 7/2010 | Shin et al. | |
| 2010/0239401 A1 | 9/2010 | Kim | |
| 2015/0215503 A1 | 7/2015 | Utsumi et al. | |
| 2016/0198598 A1* | 7/2016 | Matsumori | H05K 13/0417 |
| | | | 226/1 |
| 2016/0316592 A1* | 10/2016 | Eguchi | H05K 13/0417 |

FOREIGN PATENT DOCUMENTS

| | | |
|---|---|---|
| JP | 08-051295 A | 2/1996 |
| JP | 2002-314289 A | 10/2002 |
| JP | 2005-539370 A | 12/2005 |
| JP | 2010-507908 A | 3/2010 |
| JP | 2010-199567 A | 9/2010 |
| JP | 2011-086857 A | 4/2011 |

OTHER PUBLICATIONS

International Search Report; PCT/JP2013/067280; dated Sep. 10, 2013.
A First Office Action issued by the Chinese Patent Office dated Jul. 15, 2016, which corresponds to Chinese Patent Application No. 201380034316.6 and is related to U.S. Appl. No. 14/581,904; with English language translation.
EP Office Action dated Jan. 17, 2018, from corresponding EP Appl No. 13 808 524.6, 5 pp.

* cited by examiner

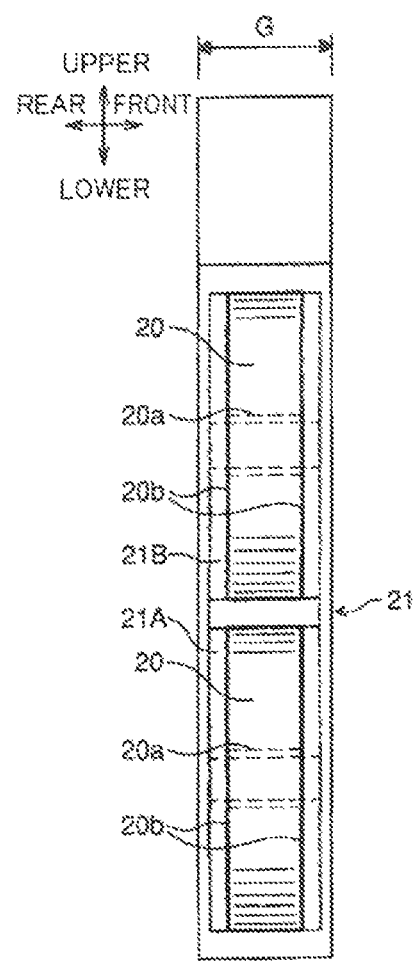

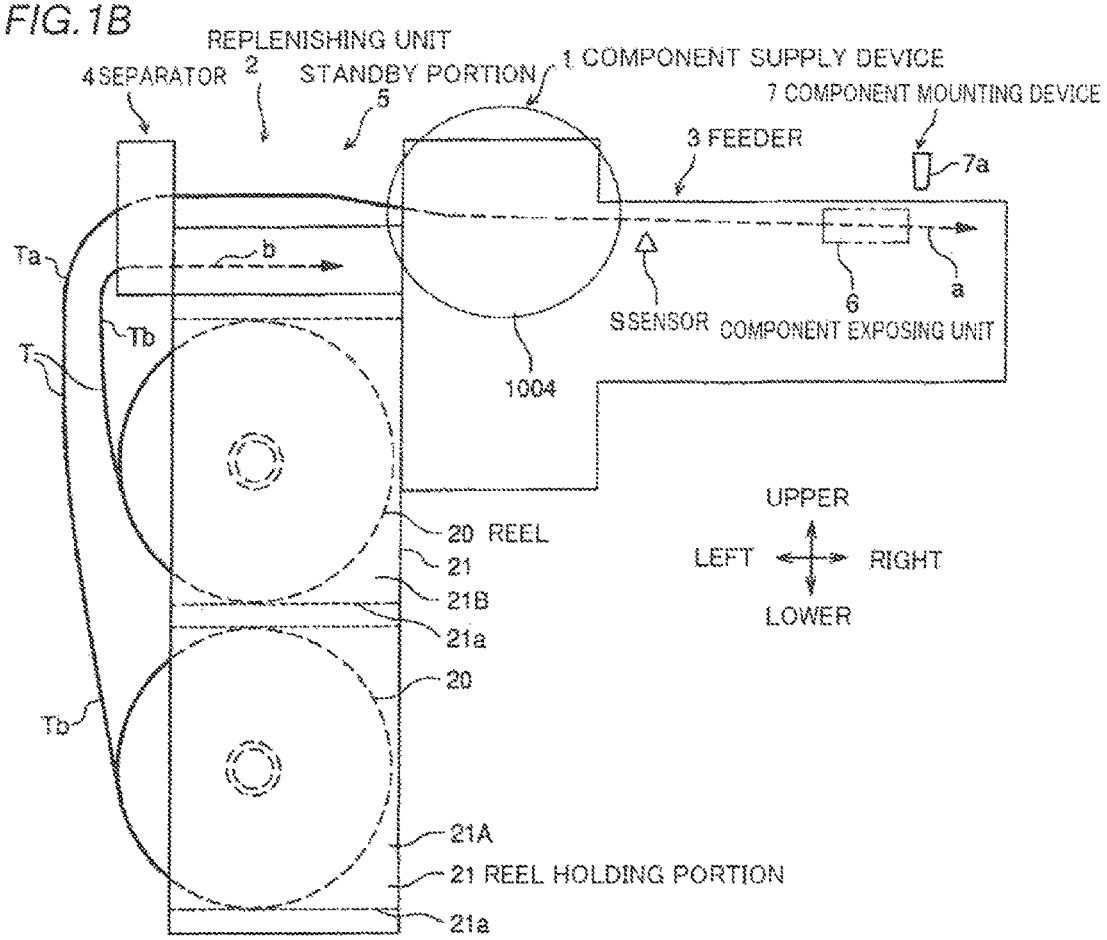

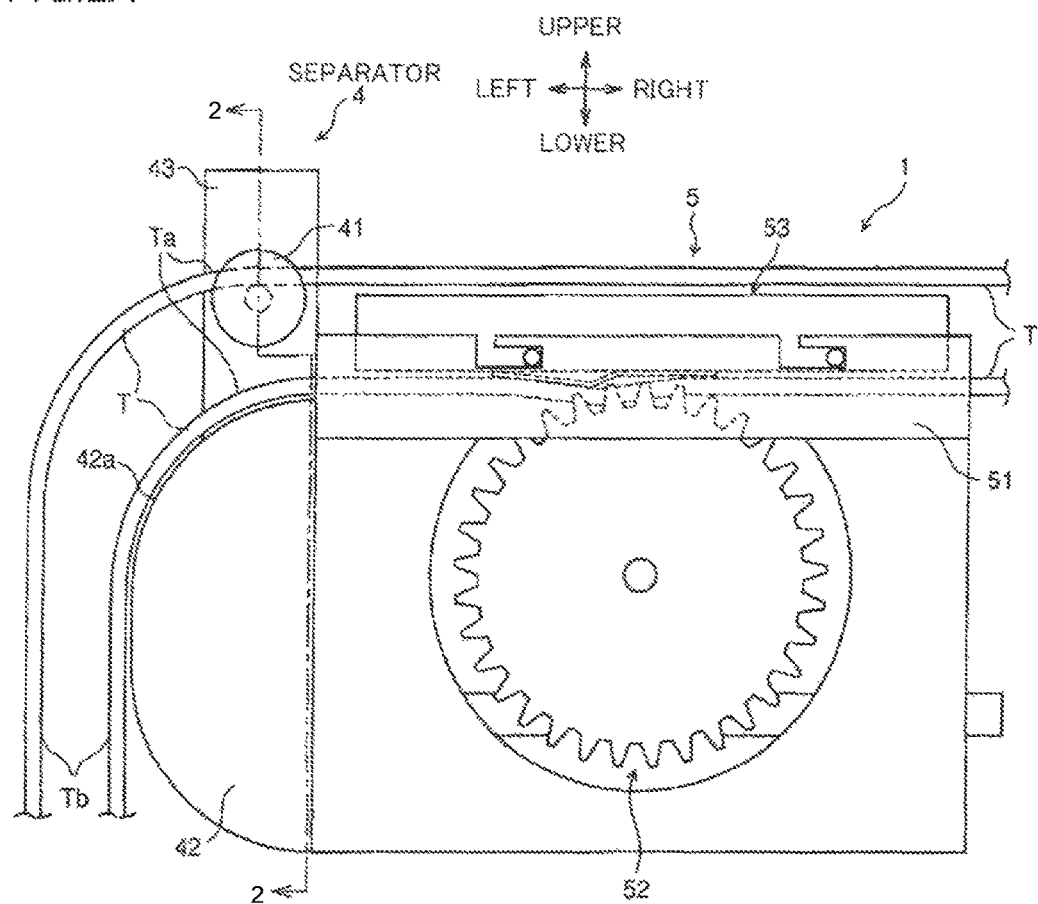

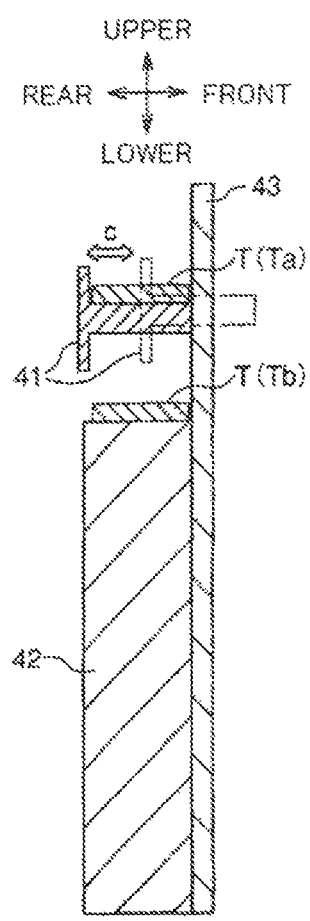

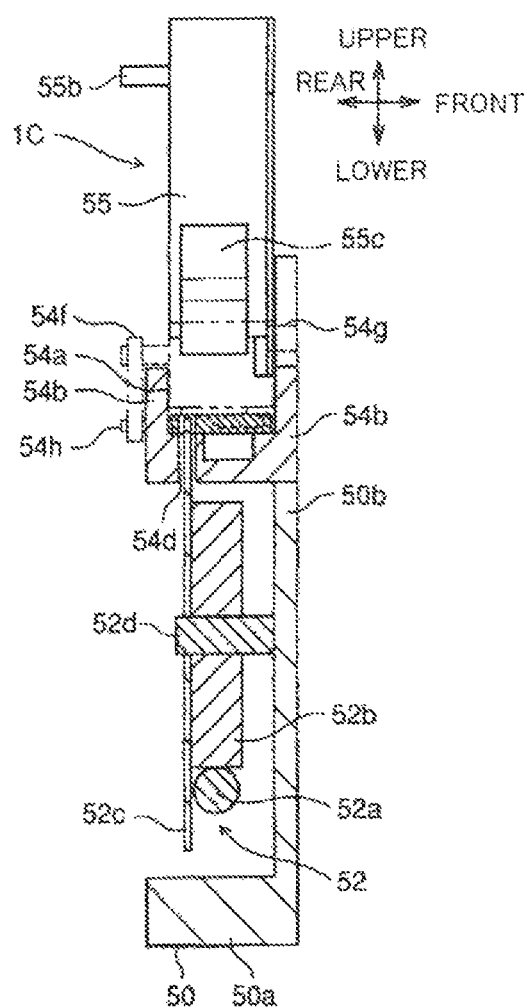

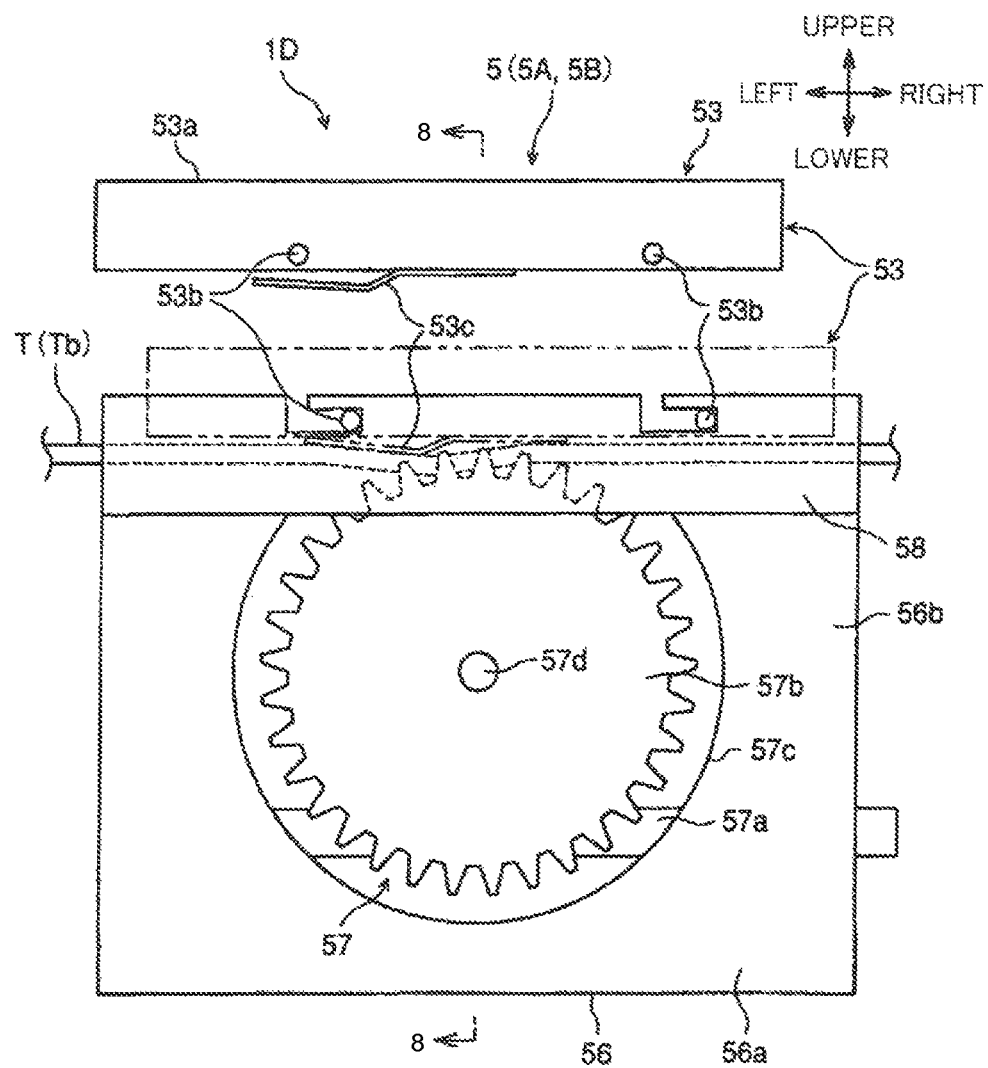

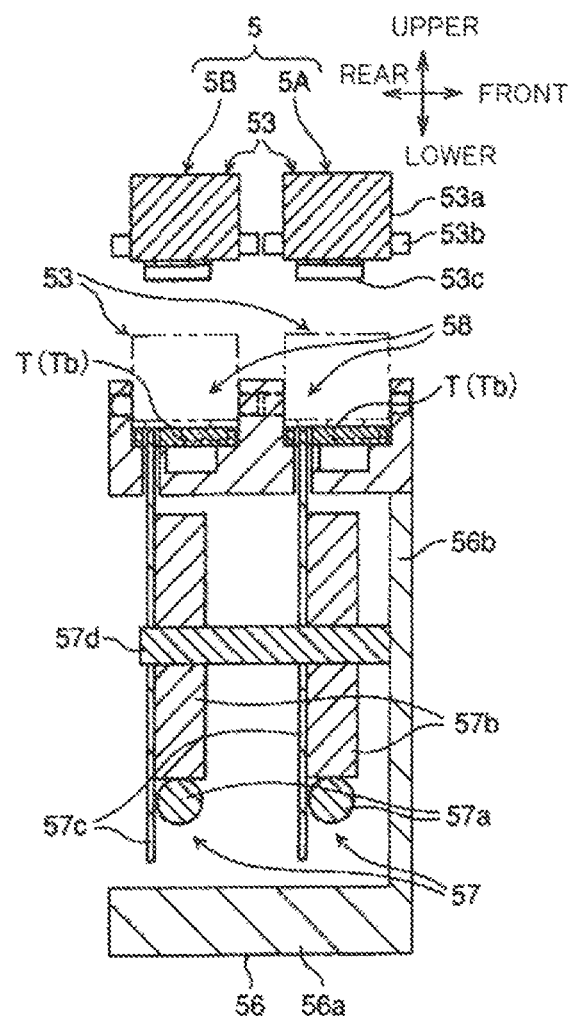

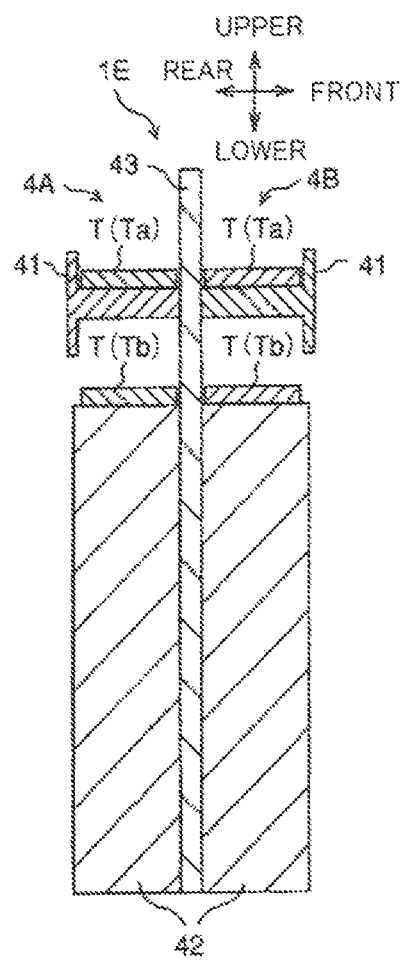

COMPONENT SUPPLY DEVICE AND COMPONENT MOUNTING DEVICE

CROSS-REFERENCE TO RELATED APPLICATIONS

This application claims benefit of priority to Japanese Patent Application No. 2012-144908 filed Jun. 28, 2012, and to International Patent Application No. PCT/JP2013/067280 filed Jun. 24, 2013, the entire content of each of which is incorporated herein by reference.

TECHNICAL FIELD

The present technical field relates to a component supply device and a component mounting device. When describing it in more detail, the present disclosure relates to a component supply device rendering electronic components extractable by exposing the electronic components present in component storage portions of a component supply tape consisting of a carrier tape on which the component storage portions storing the electronic components are parallelly arranged in a line at prescribed intervals and a cover tape blocking the component storage portions, and a component mounting device mounting electronic components on substrates with this component supply device.

BACKGROUND

Generally in a case of mounting electronic components such as chip components on electric circuit boards (hereinafter referred to as "substrates") of electronic devices, the electronic components are continuously automatically replenished while unwinding a component supply tape storing the electronic components at a prescribed pitch from a reel wound with the component supply tape by a component replenishing unit, and mounted on substrates by a component mounting device (refer to Japanese Patent Laying-Open No. 2010-199567 and Japanese Patent Laying-Open No. 2-165696, for example).

FIG. 10 is a perspective view showing a component supply tape used for a conventional component supply device. FIG. 11 is a schematic plan view showing the structure of a conventional component mounting device.

First, a component supply tape T100 is described with reference to FIG. 10.

The component supply tape T100 consists of a carrier tape T200 made of cardboard or the like, electronic components (illustration omitted) stored in component storage portions T210 formed in the carrier tape T200 and a cover tape T300 stuck to the carrier tape T200 to cover the component storage portions T210 in order to prevent the electronic components from jumping out of the component storage portions T210.

The carrier tape T200 is formed by the component storage portions T210 and feeding holes T220 making the carrier tape T200 apply transportational force for moving the component supply tape T100. The cover tape T300 is made of a PET-system resin material stuck onto the carrier tape T200 for preventing the electronic components sealed in the component storage portions T210 from dropping out of the carrier tape T200. The component supply tape T100 formed in this manner is wound on a reel 300 (see FIGS. 12A to 12C), and set on a component supply device 530 (see FIG. 11) supplying the electronic components to a component mounting device 500.

The conventional component supply device is now described. The component supply tape T100 is wound on the reel 300 and transported by a feeder (illustration omitted) while being supported by a guide, so that the electronic components are exposed from the component supply tape T100 (see FIG. 10) by an electronic component exposing unit (illustration omitted). An electronic component adsorption/mounting unit 540 (see FIG. 11) so vertically moves that the exposed electronic components are supplied to a forward end portion of the electronic component adsorption/mounting unit 540.

As shown in FIG. 11, parts of component supply devices 530 supplying various electronic components one by one to extraction positions (component adsorption positions) for the respective electronic components are attachably/detachably parallelly provided in plural on a base 590 in the conventional component mounting device 500 (electronic component mounting device) such as that disclosed in the Japanese Patent Laying-Open No. 2010-199567. The number of the types of electronic components preparable in the component mounting devices 500 can be increased as the number of the set component supply devices 530 is increased, and hence groups of the component supply devices 530 are parallelly provided on both of the left and right sides of a substrate transportation conveyor 510 at clearance intervals of not more than about 1 mm.

The substrate transportation conveyor 510 registers transported substrates 520 on prescribed positions, and transports the same in a prescribed transportation direction after electronic components are mounted on the substrates 520. X beams 550 are a pair of left and right members extended in the transportation direction for the substrates 520, and actuators (illustration omitted) consisting of linear motors or the like are mounted on both end portions thereof.

The X beams 550 are movably supported by Y beams 570 arranged in a direction orthogonal to the transportation direction for the substrates 520, and movably interposed between the component supply devices 530 and the substrates 520 by the actuators (illustration omitted). Electronic component adsorption/mounting units 540 are set on the X beams 550 along the longitudinal direction of these X beams 550. The component mounting devices 500 are further driven by driving systems (illustration omitted).

The component mounting devices 500 are so driven in the aforementioned manner that the electronic components are adsorbed in the component supply devices 530 and mounted on the substrates 520. Recognition cameras 560 and nozzle storage portions 580 are arranged between the component supply devices 530 and the substrate transportation conveyor 510. The recognition cameras 560 are those for acquiring misregistration information of the electronic components adsorbed by the electronic component adsorption/mounting units 540 in the component supply devices 530, and can confirm misregistration of the electronic components in the substrate transportation direction and the direction orthogonal to the substrate transportation direction, rotation angles, and the presence or absence of adsorption states of the electronic components and the like, by picking up images of the electronic components.

The X beams 550 and the Y beams 570 so parallelly operate that the electronic component adsorption/mounting units 540 acquire the misregistration information of the electronic components by passing the same on the recognition cameras 560 when moving from the component supply devices 530 onto the substrates 520. The nozzle storage portions 580 are storage regions for a plurality of adsorption nozzles (illustration omitted), which are necessary for adsorbing and mounting various electronic components, mounted on the electronic component adsorption/mounting units 540. In a case of being instructed to mount adsorption nozzles corresponding to the electronic components, the electronic component adsorption/mounting units 540 are moved up to the nozzle storage portions 580 by parallel operations of the X beams 550 and the Y beams 580, so that the adsorption nozzles are exchanged.

The component supply device and the electronic component exposing unit are described in Japanese Patent Laying-Open No. 2010-199567. In the component supply device 530, there has been such a problem that the component mounting device 500 cannot mount the electronic components on the substrates 520 but stops in a case where the loaded component supply tape T100 is exhausted and an operator does not immediately perform replenishment of a new component supply tape T100.

In order to solve this problem, a component supply device of Japanese Patent Laying-Open No. 2-165696 includes a unit automatically supplying a new component supply tape T100 when sensing exhaustion of a preceding component supply tape T100 and an electronic component exposing unit.

The electronic component exposing unit is provided with a cutter unit exposing a cover tape T300 on an upper portion with respect to a transportation path, thereby cutting open the cover tape T300 following transportation of a component supply tape T100, exposing electronic components, and extracting the electronic components.

FIGS. 12A to 12C are diagrams showing an automatic replenishing unit of Japanese Patent Laying-Open No. 2-165696, where FIG. 12A is a left side elevational view of a principal portion, FIG. 12B is a left side elevational view of a cassette portion, and FIG. 12C is a front elevational view of a principal portion of the automatic replenishing unit.

As shown in FIGS. 12A to 12C, a conventional automatic replenishing unit 100 for the component supply tape T100 is arranged in a form provided along with a component supply device 200, and must simultaneously perform switching of a holder 410 holding an emptied reel 310 and a holder 400 holding a reel 300 wound with the component supply tape T100 at the time of replenishment.

The automatic replenishing unit 100 is in a structure of introducing the reel 300 larger in width than the component supply tape T100 into the holder 400 larger in width than the reel 300 and further introducing/discharging the same into/from a holder changer 600 larger in width than the holder 400. When compared with the component supply device 200 having a structure falling within a full width F generally substantially equivalent to the width of the component supply tape T100, the device of the automatic replenishing unit 100 is large-scale, and has a full width F larger than that of the component supply device 200. The component supply device 200 is set on the component mounting device 500 adjacently in the direction of the full width F, and hence the number of settable component mounting devices 500 decreases when the full width F is large.

In the automatic replenishing unit for the component supply tape according to Japanese Patent Laying-Open No. 2-165696, there has been such a problem that the full width of the unit is so large that the number of component supply devices settable on a component mounting device decreases.

This leads to reduction of the number of types of electronic components preparable in the component mounting device, and hence the magnitude of the full width has been a problem to be solved in the automatic replenishing unit according to Japanese Patent Laying-Open No. 2-165696.

SUMMARY

Accordingly, the present disclosure has been contrived in order to solve the problem, and aims at providing a component supply device and a component mounting device each compact and capable of efficiently supplying electronic components.

In order to solve the aforementioned problem, a component supply device according to the present disclosure is a component supply device loading a component supply tape on a component mounting device mounting an electronic component on a substrate for exposing and supplying the electronic component from the component supply tape, including a replenishing unit performing replenishment of a new component supply tape when a preceding component supply tape is exhausted and a sensor sensing exhaustion of the preceding component supply tape, while the replenishing unit includes a reel holding portion into which a reel wound with the component supply tape is inserted and a standby portion for the component supply tape, for moving the component supply tape from the standby portion and replenishing the component supply tape when the sensor senses the exhaustion of the preceding component supply tape and a sensing signal is generated.

According to such a structure, the component supply device can render movement of the reel unnecessary by moving only the component supply tape from the standby portion and performing replenishment of the component supply tape when the sensor senses the exhaustion of the preceding component supply tape and issues a driving command at a time of performing replenishment of the component supply tape. Consequently, the structure of the replenishing unit on which the reel is arranged can be made more compact following the fact that it becomes unnecessary to move the reel at the time of replenishment of the component supply tape, while stoppage of the component mounting device can be prevented without reducing the number of types of electronic components prepared in the component mounting device.

The component mounting device is characterized in holding the electronic component supplied by the component supply device with a component holding portion and mounting the same on the substrate.

According to such a structure, the component supply device provided with the replenishing unit for the component supply tape is so set that device stoppage resulting from exhaustion can be avoided and a component mounting device having a large preparation number of types of electronic components can be implemented.

The present disclosure can provide a component supply device and a component mounting device each compact and capable of efficiently supplying electronic components. Movement of a component supply tape following replenishment can be automatically performed due to a driving command issued when a sensor built into the component supply device or a replenishing unit senses exhaustion of the component supply tape. In the component supply device, the component supply tape is formed to be smaller in width than a reel wound with the same and directly inserted into a reel holding portion along with the reel, whereby particularly the size in the width direction can be compactly suppressed as compared with the conventional device performing replenishment of the component supply tape by switching the holder with the holder changer.

BRIEF DESCRIPTION OF THE DRAWINGS

FIG. 1A is a left side elevational view showing a component supply device according to an embodiment of the present disclosure.

FIG. 1B is a schematic front elevational view showing the component supply device according to the embodiment of the present disclosure.

FIG. 2A is a schematic front elevational view showing a separator of the component supply device according to the embodiment of the present disclosure.

FIG. 2B is a diagram showing the separator of the component supply device according to the embodiment of the present disclosure, and a sectional view in an arrow-line 2-2 direction in FIG. 2A.

FIG. 7B is a diagram showing the third modification of the component supply device according to the present disclosure, and a sectional view in an arrow-line 7-7 direction in FIG. 7A.

FIG. 8A is a diagram showing a fourth modification of the component supply device according to the present disclosure, and an enlarged schematic front elevational view of a principal portion showing a standby portion.

FIG. 8B is a diagram showing the fourth modification of the component supply device according to the present disclosure, and a sectional view in an arrow-line 8-8 direction in FIG. 8A.

FIG. 9B is a diagram showing the fifth modification of the component supply device according to the present disclosure, and a sectional view in an arrow-line 9-9 direction in FIG. 9A.

DETAILED DESCRIPTION

Figure 3A:
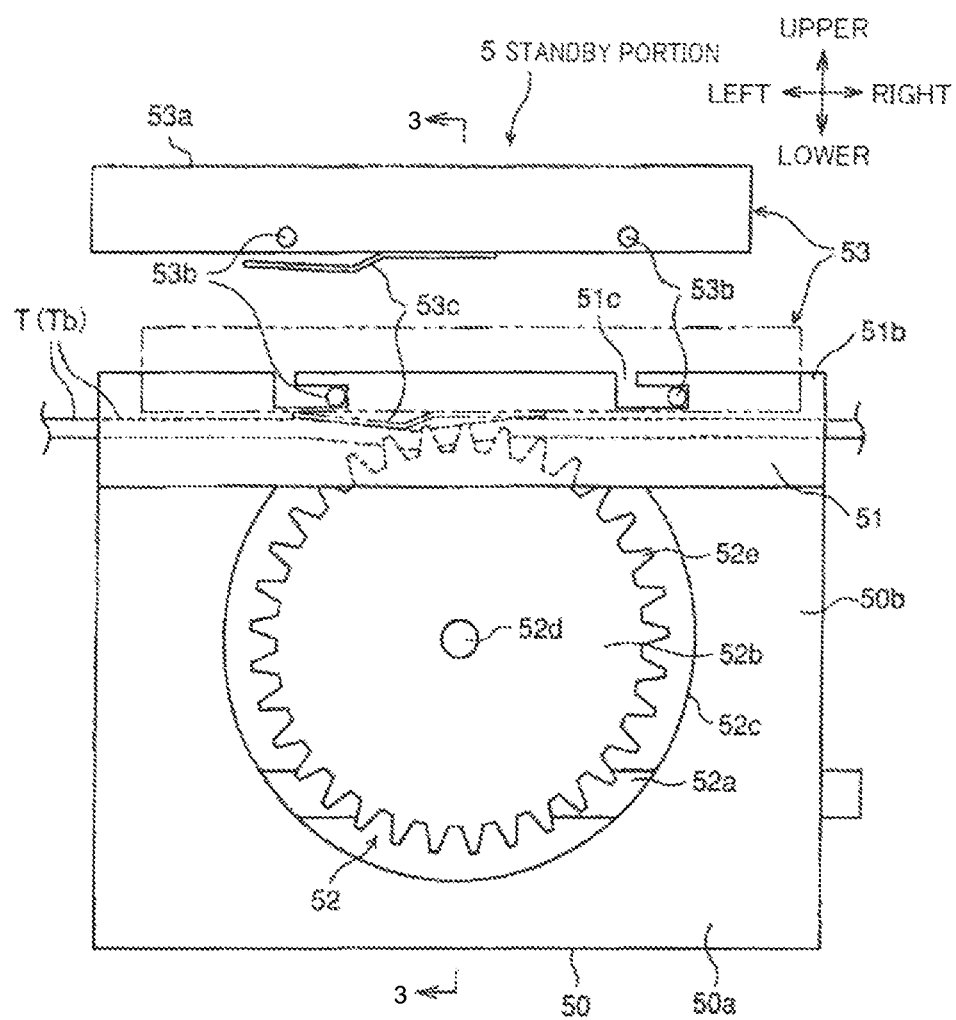
FIG. 3A is a schematic front elevational view showing a standby portion of the component supply device according to the embodiment of the present disclosure.

A component supply device and a component mounting device according to an embodiment of the present disclosure are now described. For the purpose of convenience, the following description is made assuming that the front and rear sides of the drawing shown in FIG. 1A are upper and lower sides and the left and right sides of the drawing are left and right sides.

Structure of Component Supply Device

As shown in FIGS. 1A and 1B, a component supply device 1 is a feeder supplying components to a component mounting device 7 arranged on a component transportation direction side of this component supply device 1, and configured to mainly include a replenishing unit 2 described later and a feeder 3. Such component supply devices 1 are set in the component mounting device 7 to be adjacent in a full width G direction, for example.

Structure of Replenishing Unit

As shown in FIGS. 1A and 1B, the replenishing unit 2 is a unit replenishing a new component supply tape Tb to the feeder 3 when a preceding component supply tape Ta is exhausted, and provided with respect to the feeder 3. The replenishing unit 2 is configured to include reels 20, a reel holding portion 21, a separator 4 and a standby portion 5. The replenishing unit 2 provided along with the component supply device 1 is in a structure arranging the standby portion 5 above the reel holding portion 21. In a case of extracting the reels 20 upward, therefore, the standby portion 5 interferes with the component supply tapes T. In a case of extracting the component supply tapes T in the reel holding portion 21 toward a left surface side of the device, it follows that the same interfere with the replenishing unit 2 adjacent in an upper direction. Therefore, the reels 20 are rendered attachable/detachable from the left side.

Structure of Component Supply Tape

Figure 10:
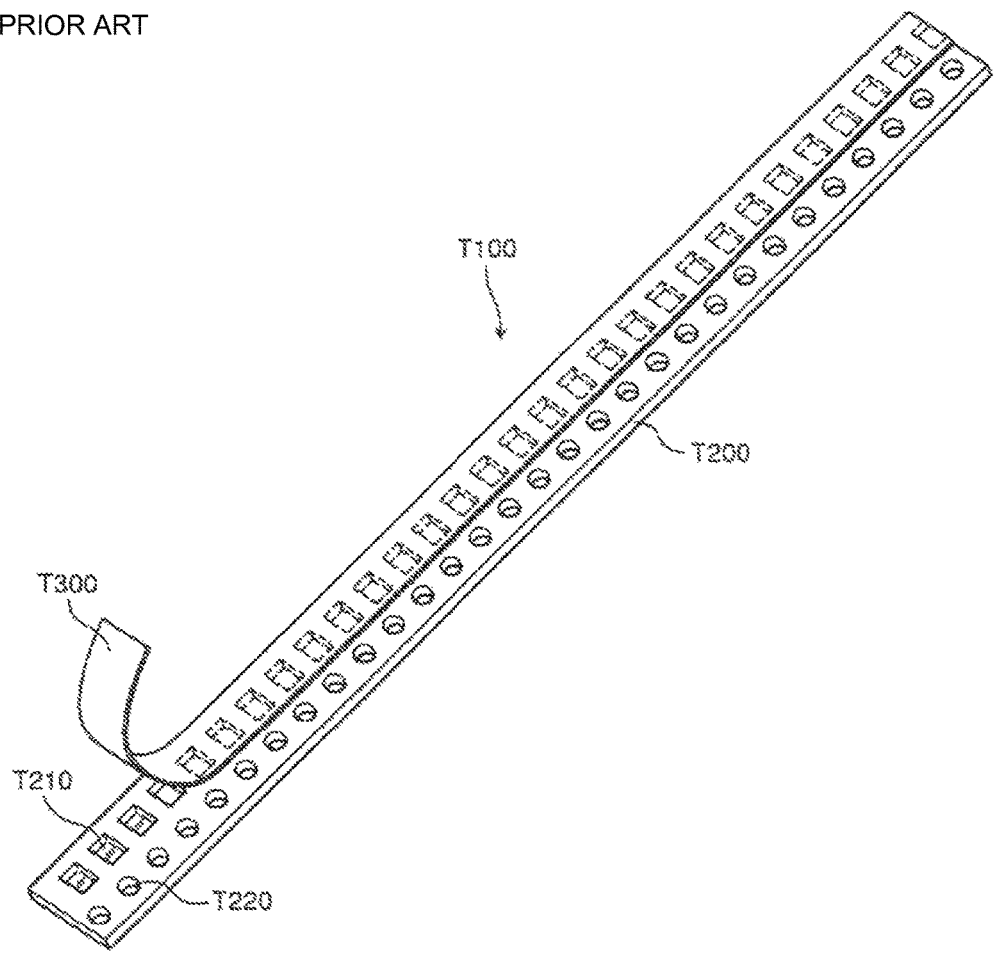
FIG. 10 is a perspective view showing a component supply tape used in a conventional component supply device.
Figure 11:
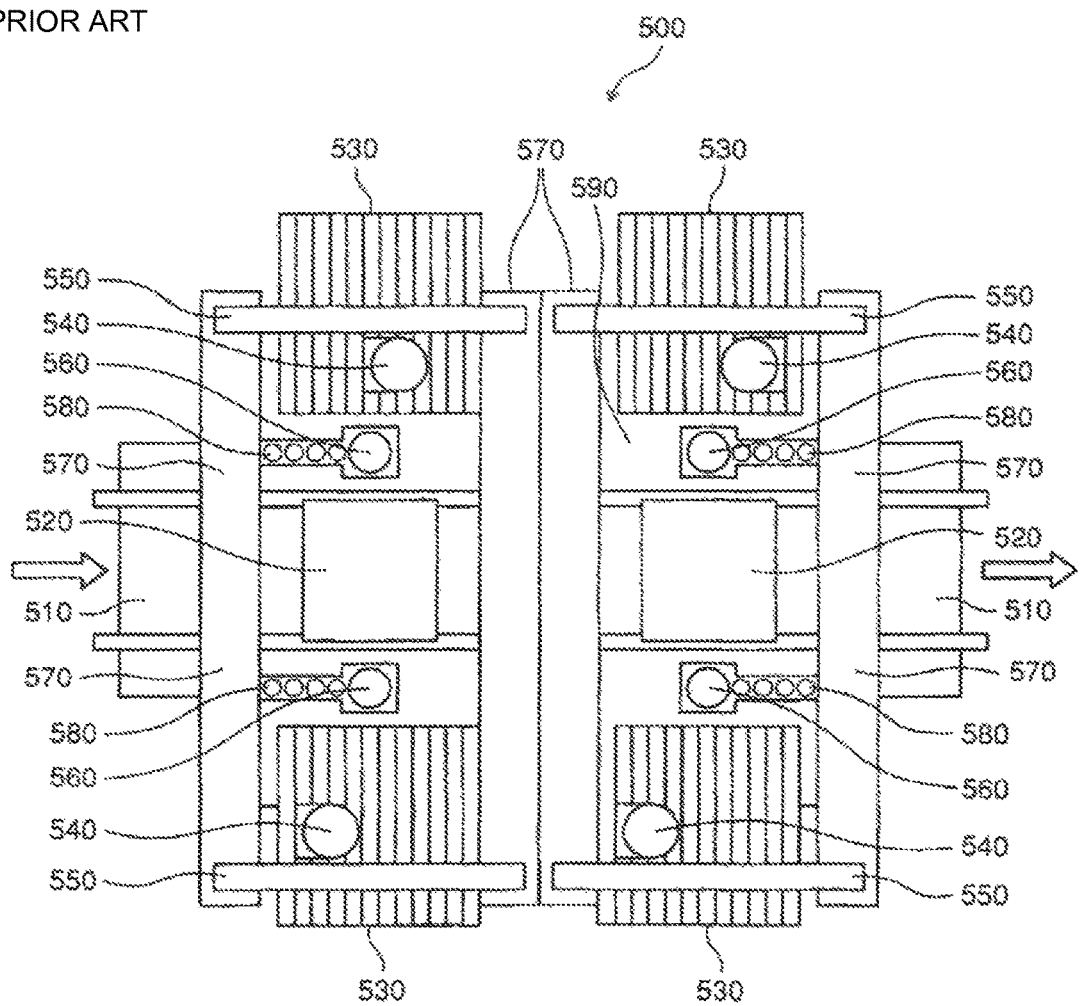
FIG. 11 is a schematic plan view showing the structure of a conventional component mounting device.
Figure 12A:
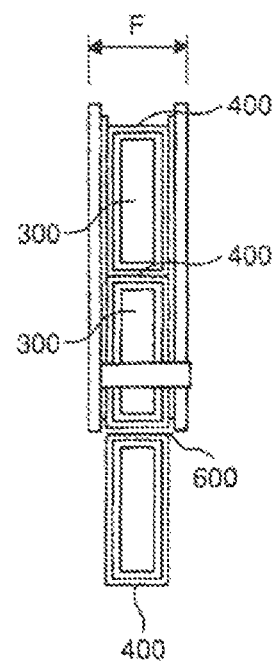
FIG. 12A is a left side elevational view of a principal portion showing an automatic replenishing unit according to Japanese Patent Laying-Open No. 2-165696.
Figure 12B:
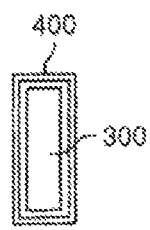
FIG. 12B is a diagram showing the automatic replenishing unit according to Japanese Patent Laying-Open No. 2-165696, and a left side elevational view of a cassette portion.
Figure 12C:
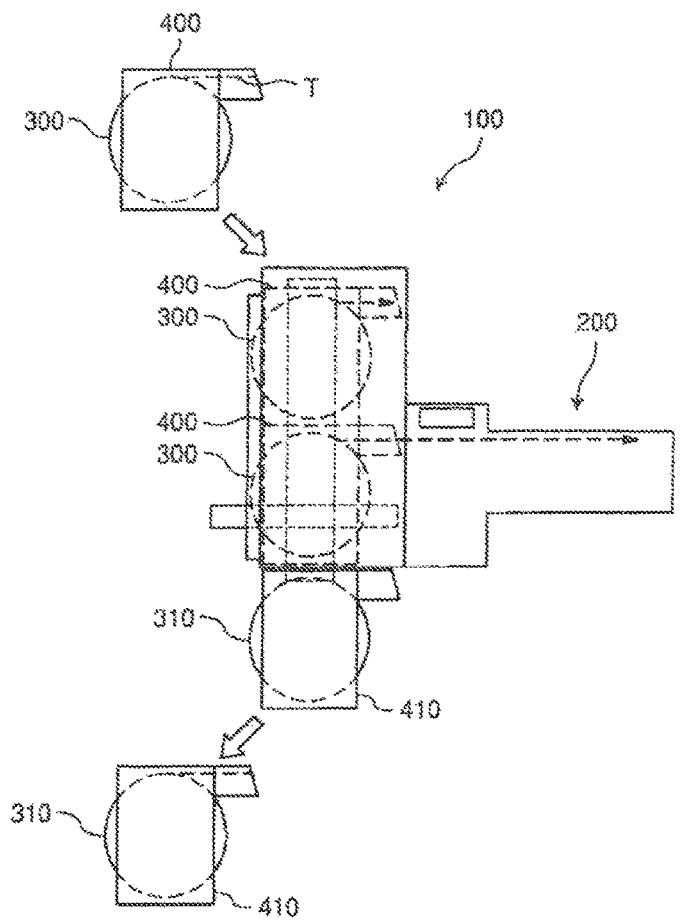
FIG. 12C is a diagram showing the automatic replenishing unit according to Japanese Patent Laying-Open No. 2-165696, and a front elevational view of a principal portion of the automatic replenishing unit.

The component supply tapes T are those identical to the aforementioned conventional one (see FIG. 10), and base end portion sides are wound on the reels 20 and arranged on the reel holding portion 21 of the replenishing unit 2 becoming base ends of transportation paths, while forward end portion sides are arranged in the component supply device 1 through the standby portion 5 described later. In other words, the forward end of the component supply tape Tb delivered from the reel 20 and replenished is set on the standby portion 5. The replenished component supply tape Tb is separated by the separator 4 in the vertical direction with respect to the preceding component supply tape Ta. The forward end of the replenished component supply tape Tb stands by on the standby portion 5. Referring to FIG. 1B, arrows a and b indicating the preceding component supply tape Ta and the replenished component supply tape Tb indicate the forward end portions of the respective tapes. At the time of replenishment, the standby portion 5 moves only the component supply tapes T, while the reels 20 only pivot and do not move.

Structure of Reel

As shown in FIGS. 1A and 1B, the reels 20 are tape reels provided in the form of bobbins wound with the component supply tapes T, and stored in the reel holding portion 21. The reels 20 consist of cylindrical portions 20a in the form of hollow shafts wound with the component supply tapes T and flange portions 20b in the form of discs formed on both ends of the cylindrical portions 20a. Two reels 20 are attachably/detachably fitted and set into the reel holding portion 21 in the form of a box whose left sides are open.

Structure of Reel Holding Portion

As described above, the reel holding portion 21 is a region holding the reels 20, and consists of box-shaped members so formed that two reels 20 are arrangeable in upper and lower stages. The reel holding portion 21 consists of a lower stage side tape storage portion 21A and an upper stage side tape storage portion 21B having openings 21a for introducing/discharging the reels 20 on left sides respectively and provided in the form of vertically long rectangles in side elevational view for transversely storing the reels 20. The reel holding portion 21 is not restricted to the upper and lower two stages, but may be formed in three or more stages.

The lower stage side tape storage portion 21A and the upper stage side tape storage portion 21B are in structures directly storing the reels 20 in untouched states without interposing other members therebetween, and hence it is enabled to shorten widths G in the anteroposterior direction to the minimum lengths.

Structure of Separator

As shown in FIGS. 2A and 2B, the separator 4 is a unit for dividing and arranging the component supply tapes T unwound from the reels 20 of the upper and lower two stages arranged in the lower stage side tape storage portion 21A and the upper stage side tape storage portion 21B respectively into upper and lower two stages at a prescribed interval in the horizontal direction. This separator 4 is mainly constituted of an upper stage tape holding portion 41, a lower stage tape holding portion 42 and an upright plate 43, and provided in a state adjacent to the standby portion 5.

The upper stage tape holding portion 41 is a guide region supporting the component supply tape T unwound from the reel 20 arranged on the lower stage side tape storage portion 21A and delivering the same to the standby portion 5. The upper stage tape holding portion 41 consists of a bobbin-shaped rotating member pivotally supported by the upright plate 43 in a state pivotable and movable in an axial direction (arrow c direction), for example. Therefore, an operator is required to move the replenished component supply tape Tb from the lower stage tape holding portion 42 to the upper stage tape holding portion 41 at a time of exchange of the component supply tapes T as described in detail later, while movement of the component supply tapes T is enabled by moving the upper stage tape holding portion 41 in the axial direction and expanding/contracting the same, even if another replenishing portion is adjacent to a side surface side.

The lower stage tape holding portion 42 is a guide region supporting the component supply tape T unwound from the reel 20 arranged in the upper stage side tape storage portion 21B and delivering the same to the standby portion 5. The lower stage tape holding portion 42 is arranged under the upper stage tape holding portion 41, and delivers the component supply tape T from the upper stage tape storage portion 21B toward the standby portion 5 in a state substantially parallel to the component supply tape T delivered from the upper stage tape holding portion 41 at a prescribed interval. The lower stage tape holding portion 42 consists of a member having a tape support surface 42a arcuate in a front elevational view.

The upright plate 43 is a tubular plate member supporting the upper stage tape holding portion 41 and the lower stage tape holding portion 42 from side surfaces. The upright plate 43 rotatably pivotally supports the upper stage tape holding portion 41 in a cantilever state on an upper portion, and sets the lower stage tape holding portion 42 in a cantilever state on a lower portion thereof, for example.

The separator 4 can align the preceding component supply tape Ta and the replenished component supply tape Tb with each other in the vertical direction by supporting the preceding component supply tape Ta incorporated into the component supply device 1 in the upper stage tape holding portion 41 and the component supply tape Tb replenished in the lower stage tape holding portion 42, whereby the full width of the separator 4 can be compactly suppressed. It follows that the replenished component supply tape Tb stands by on a lower side in the vertical direction with respect to the preceding component supply tape Ta while the forward end portion is mounted on the standby portion 5.

The lower stage tape holding portion 42 and the upper stage tape holding portion 41 are so vertically arranged at the prescribed interval that it is possible to move the component supply tape T delivered from the lower stage side tape storage portion 21A between the lower stage tape holding portion 42 and the upper stage tape holding portion 41.

Structure of Standby Portion

Figure 3B:
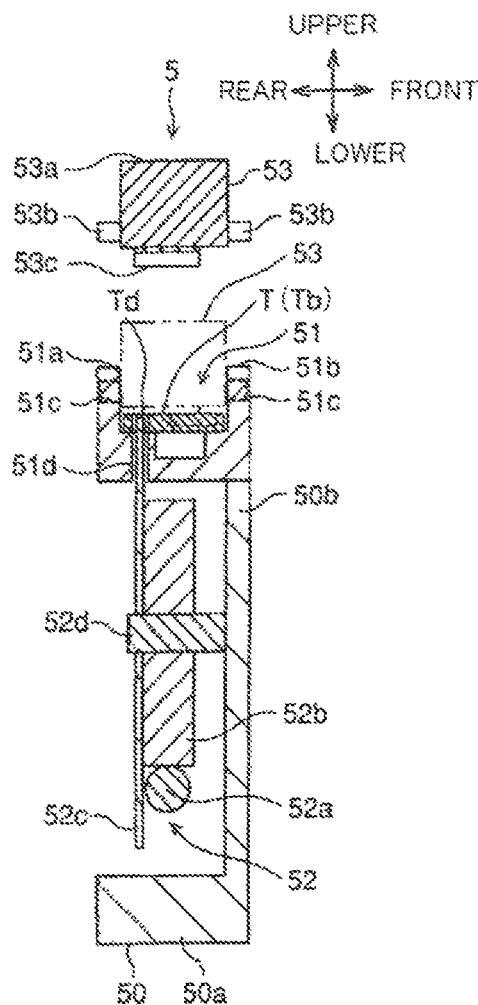
FIG. 3B is a diagram showing the standby portion of the component supply device according to the embodiment of the present disclosure, and a sectional view in an arrow-line 3-3 direction in FIG. 3A.

As shown in FIGS. 3A and 3B, the standby portion 5 is a unit putting the component supply tape Tb for replenishment on standby and delivering and replenishing the component supply tape Tb from this standby portion 5 when a sensor S (see FIG. 1B) senses exhaustion of the preceding component supply tape Ta. This standby portion 5 is mainly constituted of a base 50, a transportation path 51, a transportation mechanism 52 and a lid member 53.

As shown in FIG. 1B, the sensor S is a detector sensing the exhausted component supply tape T, and consists of a photointerrupter consisting of a light emitter and a photodetector, for example. The sensor S is set on the replenishing unit 2 or the feeder 3.

As shown in FIGS. 3A and 3B, the base 50 is a region supporting the whole standby portion 5, and includes a base 50a horizontally provided on a lower end portion and a sidewall 50b uprightly provided from this base 50a in the upper direction.

The transportation path 51 is a region guiding the component supply tapes T moving in the transportation direction, and has a guide groove 51a provided substantially in the form of a recess portion as viewed in vertical section, a pair of front and rear sidewalls 51b formed on both sides of this guide groove 51a, stop grooves 51c formed on front, rear, left and right sides to be opposed to this pair of sidewalls 51b respectively and a gear insertion groove 51d into which an upper end portion of a transportation gear 52c described later is inserted.

The guide groove 51a consists of a recessed groove horizontally extended along the transportation direction, so that the component supply tapes T and the lid member 53 are movably fitted into this guide groove 51a. The width of the guide groove 51a is larger than the width of the component supply tapes T by about several mm after the decimal point.

Left and right end portions of the component supply tapes T are slidably inserted into a space between the front and rear sidewalls 51b, while the lid member 53 is inserted thereinto to press the component supply tapes T from above.

The pair of front and rear stop grooves 51c are L-shaped grooves, into which stop pins 53b protruded on front and rear surfaces of the lid member 53 are inserted respectively thereby holding the lid member 53 on the transportation path 51. The lid member 53 is stopped by these stop grooves 51c and the stop pins 53b, so that the replenished component supply tape Tb is attachable/detachable from the upper direction of the standby portion 5. In this case, the lid member 53 can be completely separated from the transportation path 51 by removing the stop pins 53b from the stop grooves 51c, whereby the replenished component supply tape Tb can be easily attached/detached.

As shown in FIGS. 3A and 3B, the gear insertion groove 51d is a slitlike groove into which an upper portion of the transportation gear 52c is inserted so that tooth profile portions of the transportation gear 52c engage with feeding holes Td of each component supply tape T arranged on the inner bottom of the guide groove 51a.

The transportation mechanism 52 is configured to include an unillustrated motor, a driving gear 52a rotated/driven by this motor, a transmission gear 52b meshing with this driving gear 52a, decelerating/rotating the same and transmitting rotation, a transportation gear 52c rotating with the transmission gear 52b so that tooth profile portions 52e are arranged in engagement with the feeding holes Td of the component supply tape T for feeding this component supply tape T and a pivotal support member 52d pivotally supporting the transportation gear 52c and the transmission gear 52b, for example.

The unillustrated motor consists of an electric motor having the driving gear 52a as a rotor. The driving gear 52a consists of a worm gear, for example, and is provided on a motor shaft. The transmission gear 52b consists of a worm wheel meshing with the driving gear 52a. The transportation gear 52c is a gear, whose thickness is small, engaging with the feeding holes Td of the component supply tape T, and consists of a sprocket, for example. The pivotal support member 52d is a coupled shaft rod integrally rotating with the transportation gear 52c and the transmission gear 52b, and a base end portion is fixed to the sidewall 50b.

The lid member 53 is a member blocking the transportation path 51 arranging the component supply tape T in the guide groove 51a from an upper side and elastically pressing and supporting the component supply tape T to a lower direction from the upper side. The lid member 53 includes a lid member body 53a, the stop pins 53b and a plate spring 53c.

The lid member body 53a consists of a member substantially in the form of a thick plate extended in the transportation direction, has the stop pins 53b on left and right lower side regions of front and rear surfaces, and has the plate spring 53c on an intermediate portion of the lower surface.

The stop pins 53b consist of pins in the form of round bars engaging with the stop grooves 51c, and these stop pins 53b are so stopped on horizontal regions of the stop grooves 51c that a state where the plate spring 53c presses the component supply tape T toward the lower direction is maintained.

The plate spring 53c is a spring member for suppressing the replenished component supply tape Tb toward the transportation mechanism 52 and the transportation path 51 from above and bringing the former into contact with the latter, and an end portion is fixed to the lower surface of the lid member 53, to have elasticity in the vertical direction.

Structure of Component Exposing Unit

A component exposing unit 6 shown in FIG. 1B is a unit exposing electronic components in component storage portions of a carrier tape by cutting open a cover tape stuck to the upper surface of each component supply tape T with a cutter portion (illustration omitted), and arranged on the transportation path 51.

Structure of Component Mounting Device

The component mounting device 7 is a device mounting the exposed electronic components on the component supply tape T on substrates (illustration omitted) by adsorbing the same with a component extraction portion 7a consisting of an air nozzle or the like.

Action

Actions of the component supply device and the component mounting device according to the embodiment of the present disclosure are now described mainly with reference to FIGS. 4A to 4E. First, a replenishing operation to the component supply device 1 with the replenishing unit 2 is described.

Figure 4A:
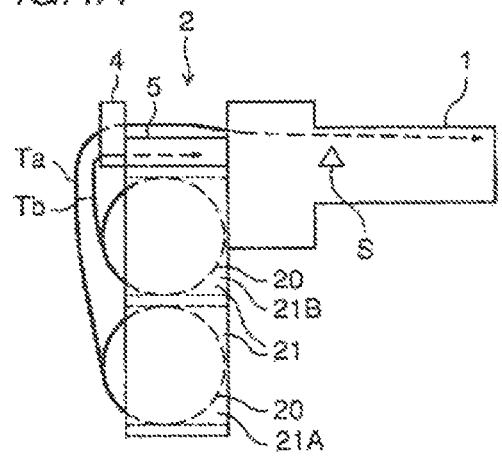
FIG. 4A is a diagram showing a step of the component supply device according to the embodiment of the present disclosure, and a schematic front elevational view showing an initial state at a time of replenishing a component supply tape.

The replenishing operation of the component supply tape T progresses from a state of FIG. 4A described later to FIG. 4E. As shown in FIG. 4A, an initial state is a state where the replenished component supply tape Tb stands by on the standby portion 5 on the lower side in the vertical direction with respect to the preceding component supply tape Ta. The separator 4 separates and arranges the preceding component supply tape Ta and the replenished component supply tape Tb delivered from the lower stage side tape storage portion 21A and the upper stage side tape storage portion 21B in the vertical direction.

Figure 4B:
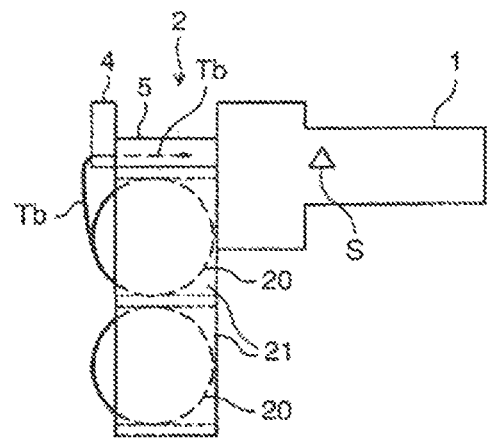
FIG. 4B is a diagram showing a step of the component supply device according to the embodiment of the present disclosure, and a schematic front elevational view showing a state where a preceding component supply tape is used up.

In subsequent FIG. 4B, exhaustion of the preceding component supply tape Ta is sensed by the sensor S built into the component supply device 1 when the preceding component supply tape Ta is exhausted, a driving command is transmitted from a control unit (illustration omitted) to the standby portion 5 of the replenishing unit 2, so that a motor (illustration omitted) rotates following this and the transportation mechanism 52 (see FIG. 2A) is driven.

Figure 4C:
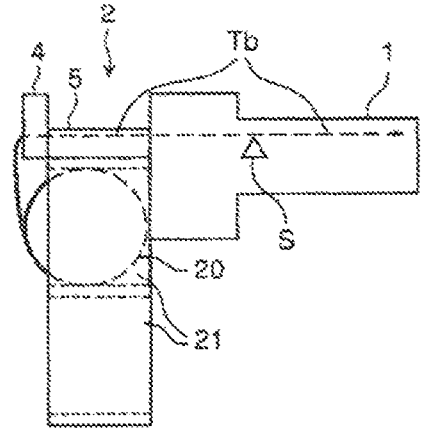
FIG. 4C is a diagram showing a step of the component supply device according to the embodiment of the present disclosure, and a schematic front elevational view showing a state at a time of replenishing a component supply tape.

In subsequent FIG. 4C, the replenished component supply tape Tb moves from the standby portion 5 to the component supply device 1 due to driving of the transportation mechanism 52, so that replenishment of the component supply tape T is performed. The operator detaches the emptied reel 20 (reel having been wound with the preceding component supply tape Ta) from the lower stage of the reel holding portion 21 after the replenishment of the component supply tape T is performed.

Figure 4D:
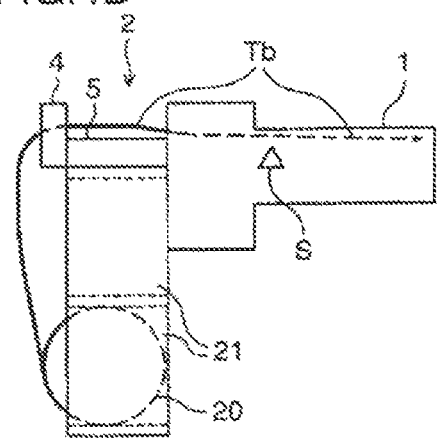
FIG. 4D is a diagram showing a step of the component supply device according to the embodiment of the present disclosure, and a schematic front elevational view showing a state at a time of moving a reel from a tape holding portion on an upper end to a tape holding portion on a lower stage.

In subsequent FIG. 4D, the operator moves the replenished component supply tape Tb to a hollow of the standby portion 5 in the upper direction while detaching the replenished component supply tape Tb from the standby portion 5, and moves the reel 20 wound with the replenished component supply tape Tb from the upper stage to the lower stage of the reel holding portion 21 by changing a set place of the reel 20 wound with the replenished component supply tape Tb from the upper stage side tape storage portion 21B of the separator 4 to the lower stage side tape storage portion 21A.

Figure 4E:
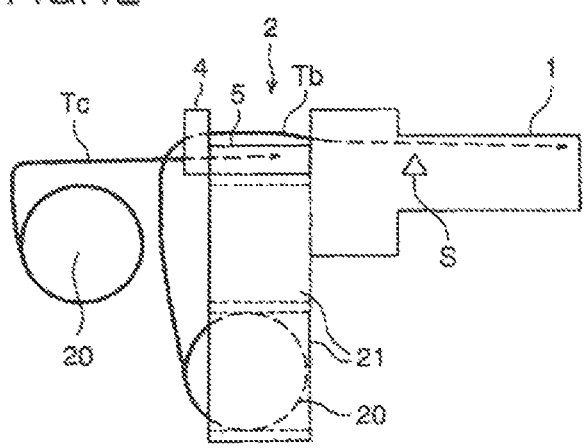
FIG. 4E is a diagram showing a step of the component supply device according to the embodiment of the present disclosure, and a schematic front elevational view showing a state of the reel holding portion at a time of newly replenishing a reel.

In subsequent FIG. 4E, the operator sets the newly prepared replenished component supply tape Tb on the lower stage side tape storage portion 21A of the separator 4 while mounting the same on the standby portion 5 and introduces the reel 20 wound with the component supply tape T into the upper stage side tape storage portion 21B of the reel holding portion 21, thereby returning to the original initial state shown in FIG. 4A.

Exchange or a replacing operation of the reel 20 is performed after the replenished component supply tape Tb is replenished to the component supply device 1, and hence no stoppage of the component mounting device 7 following the operation takes place. In other words, the exchange of the reel 20 may not be synchronized with the replenishment timing for the component supply tape T, but the operator may execute the same at an arbitrary convenient time. However, the same must be executed before the preceding replenished component supply tape Tb is exhausted from the brand-new state.

Thus, the replenishing unit 2 moves only the replenished component supply tape Tb at the time of the replenishment of the component supply tape T so that a member such as that for moving a member other than the component supply tape T becomes unnecessary, whereby the full width of the overall device can be compactly suppressed by simplifying the structure of the replenishing unit 2 due to the cancellation of the member.

The replenished component supply tape Tb is put on standby on the lower side of the preceding component supply tape Ta in the vertical direction in the state arranged on the standby portion 5, and the transportation mechanism 52 can quickly move the replenished component supply tape Tb to the component supply device 1 when the preceding component supply tape Ta is exhausted and power resulting from the motor (illustration omitted) is applied to a driving system for the transportation mechanism 52 of the standby portion 5 due to an exhaustion sensing signal of the sensor S.

In the component supply device 1, the component supply tape T is formed to be smaller in width than the reel 20 wound with the same to be directly inserted into the reel holding portion 21 along with the reel 20, whereby particularly the size in the width direction (anteroposterior direction) can be compactly suppressed as compared with the conventional device performing the replenishment of the component supply tape by switching the holder with the holder changer.

First Modification

While the present disclosure has been described on the basis of the embodiment, the present disclosure is not restricted to the structure described in the aforementioned embodiment, but the structure thereof can be properly changed in a range not deviating from the subject matter thereof, including an operation of properly combining or selecting the structures described in the aforementioned embodiment. Description of the structures already described is omitted by assigning the same signs.

Figure 5:
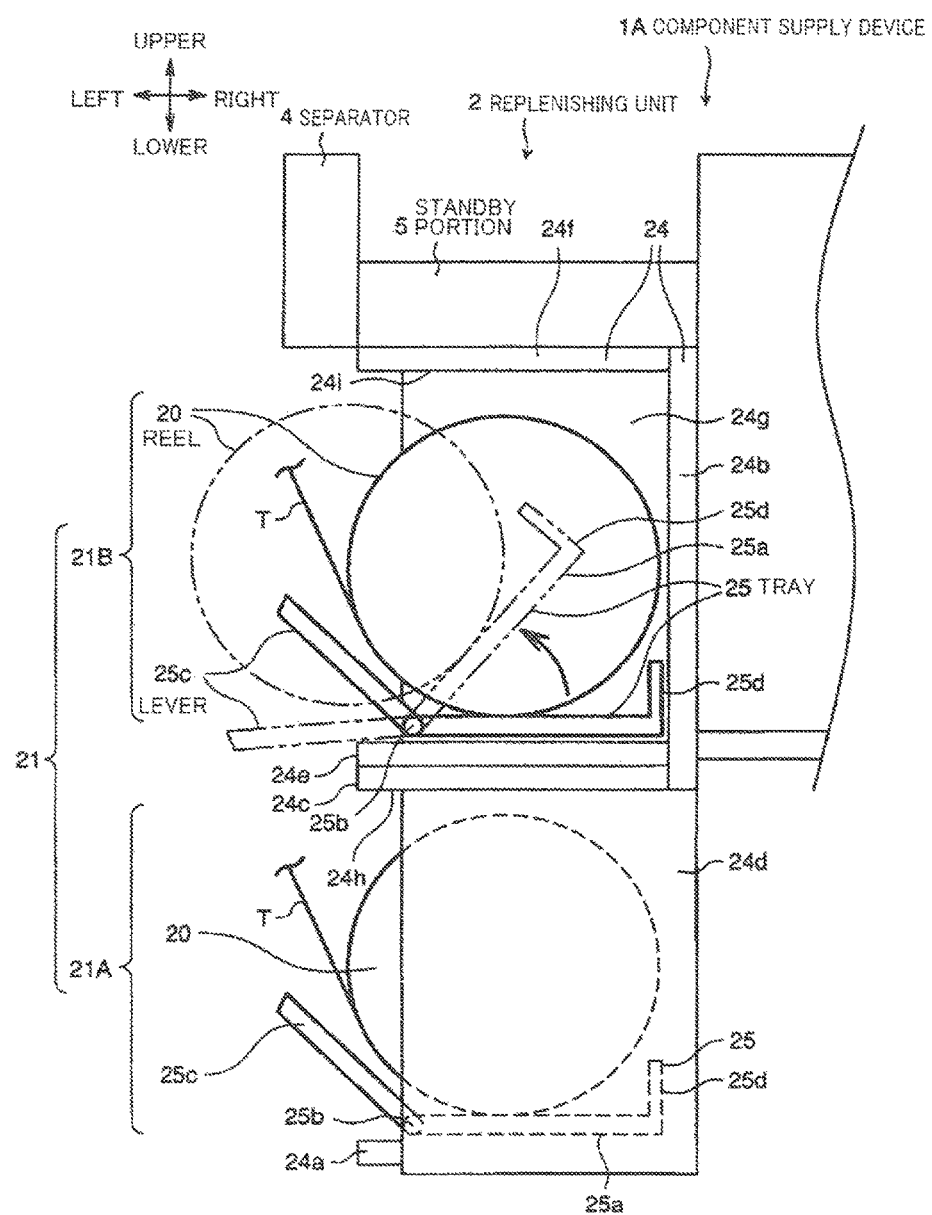
FIG. 5 is a diagram showing a first modification of the component supply device according to the present disclosure, and an enlarged schematic front elevational view of a principal portion showing a reel holding portion.

FIG. 5 is a diagram showing a first modification of the component supply device according to the present disclosure, and a schematic enlarged front elevational view of a principal portion showing a reel holding portion.

In a reel holding portion 21 of a component supply device 1A, levers 25c and trays 25 may be those of pivotal tray types pivoting on tray pivot/support portions 25b, as shown in FIG. 5.

In this case, the reel holding portion 21 is mainly constituted of a support case 24 and the trays 25, stored in the support case 24, having the levers 25c.

The reel holding portion 21 is so formed that the widths of side plate members 24d are at values capable of storing reels 20 with no spaces, and no other members are present between the reels 20 and the reel holding portion 21. As to the reel holding portion 21, therefore, the whole of a replenishing unit 2 can be compactified by reducing the full width (length in the anteroposterior direction) of this reel holding portion 21. The reel holding portion 21 is formed in a multistage manner (in two stages) of a lower stage side tape storage portion 21A arranged on a lower stage side and an upper stage side tape storage portion 21B arranged thereon, so that the reels 20 can be arranged in upper and lower stages.

The support case 24 is a member forming an outer housing of the reel holding portion 21, and a member for accomplishing functions of a support member supporting a lower side of a standby portion 5 and a plate member forming upper surfaces, back surfaces, lower surfaces, side surfaces and openings of the lower stage side tape storage portion 21A and the upper stage side tape storage portion 21B in the form of boxes consisting of the upper and lower stages.

This support case 24 is configured to include a lower surface member 24a, a back surface member 24b, an upper surface member 24c, the side plate members 24d, a lower surface member 24e, an upper surface member 24f, side plate members 24g and openings 24h and 24i described later respectively.

The lower surface member 24a is a bottom plate member forming the lower surface of the lower stage side tape storage portion 21A, and the trays 25 are placed on this lower member 24a.

The back surface member 24b is a plate member supporting the standby portion 5 and forming back surfaces of the lower stage side tape storage portion 21A and the upper stage side tape storage portion 21B. The back surface member 24b is arranged to extend from a right-side (rear-side) end portion of the lower surface member 24a up to a right-side (rear-side) end portion of the standby portion 5.

The upper surface member 24c is a plate member forming the upper surface of the lower stage side tape storage portion 21A.

The side plate members 24d consist of a pair of front and rear plate members forming the side surfaces of the lower stage side tape storage portion 21A.

The lower surface member 24a is a plate member forming the lower surface of the upper stage side tape storage portion 21B.

The upper surface member 24f is a plate member supporting the lower side of the standby portion 5 and forming the upper surface of the upper stage side tape storage portion 21B.

The side plate members 24g consist of a pair of front and rear plate members forming the side surfaces of the upper stage side tape storage portion 21B.

The openings 24h and 24i introducing/discharging the reels 20 respectively are formed on left sides of the lower stage side tape storage portion 21A and the upper stage side tape storage portion 21B.

The trays 25 are members receiving the reels 20, and pivotably provided on the lower stage side tape storage portion 21A and the upper stage side tape storage portion 21B respectively. The respective trays 20 arranged on the lower stage side tape storage portion 21A and the upper stage side tape storage portion 21B have the same shapes, and hence only one is properly described, while description of the other member is omitted by assigning identical signs.

Each tray 25 includes a receiving portion 25a receiving each reel 20, the tray pivot/support portion 25b arranged on a side of this receiving portion 25a closer to the opening 24h or 24i, the lever 25c extended from this tray pivot/support portion 25b in an outward direction and a stopper 25d bent/formed upward from an inner side end portion of the receiving portion 25a.

The receiving portion 25a is provided in each of the lower stage side tape storage portion 21A and the upper stage side tape storage portion 21B to pivot on the tray pivot/support portion 25b in the vertical direction along with the lever 25c when the lever 25c is operated in the vertical direction as shown by phantom lines in the upper stage side tape storage portion 21B of FIG. 5.

The tray pivot/support portion 25b is a shaft member for rotatably arranging the tray 25 in the lower stage side tape storage portion 21A or the upper stage side tape storage portion 21B, and set on a lower surface in the opening 24h or 24i on the lower surface member 24a or 24e.

The lever 25c is a member operated for pivoting the tray 25 when placing the reel 20 on the receiving portion 25a and extracting the reel 20, and arranged to be pivotable on the tray pivot/support portion 25b in the vertical direction. This lever 25c is bent/formed at an angle obtuse about the tray pivot/support portion 25b with respect to the receiving portion 25a.

The lever 25c is operated in a lower side direction as shown by phantom lines when placing the reel 20 on the receiving portion 25a and extracting the reel 20, to enter a horizontal state from a state obliquely arranged in front of the opening 24i or 24j. Following this, the receiving portion 25a pivots on the tray pivot/support portion 25b in the upper direction and thrusts the reel 20 to the outer direction of the opening 24h or 24i, thereby rendering the reel 20 easily introducible/extractable into/from the lower stage side tape storage portion 21A or the upper stage side tape storage portion 21B.

The stopper 25d is a protruding section for preventing the reel 20 placed on the receiving portion 25a from moving toward the inner side of the lower stage side tape storage portion 21A or the upper stage side tape storage portion 21B beyond the receiving portion 25a. The stopper 25d is integrally formed on an end portion of the receiving portion 25a, and pivots on the tray pivot/support portion 25b along with the receiving portion 25a when the lever 25c is operated.

Thus, the pivotable trays 25 having the levers 25c are so arranged on the lower stage side tape storage portion 2A and the upper stage side tape storage portion 21B that the whole trays 25 pivot on the tray pivot/support portions 25b and the levers 25c enter the horizontal states from the front sides of the openings 24h and 24j as shown by phantom lines in FIG. 5 while thrusting the reels 20 received on the receiving portions 25a toward the outer direction of the openings 24h and 24i when the operator presses down the levers 25c, whereby the reels 20 can be rendered easily attachable/detachable.

When the operator presses up the levers 25c, the whole trays 25 pivot on the tray pivot/support portions 25b and the levers 25c move toward the front sides of the openings 24h and 24j to enter states capable of preventing the reels 20 on the receiving portions 25a from dropping out of the lower stage side tape storage portion 21A and the upper stage side tape storage portion 21B, as shown by solid lines in FIG. 5. At this time, the receiving portions 25a enter horizontal states in contact with the upper surfaces of the lower surface members 24a and 24e and the horizontal states are maintained due to the weight of the reels 20, to be pivotably arranged. Thus, the reels 20 can be placed within the lower stage side tape storage portion 21A and the upper stage side tape storage portion 21B in stable states with the receiving portions 26a.

Second Modification

Figure 6:
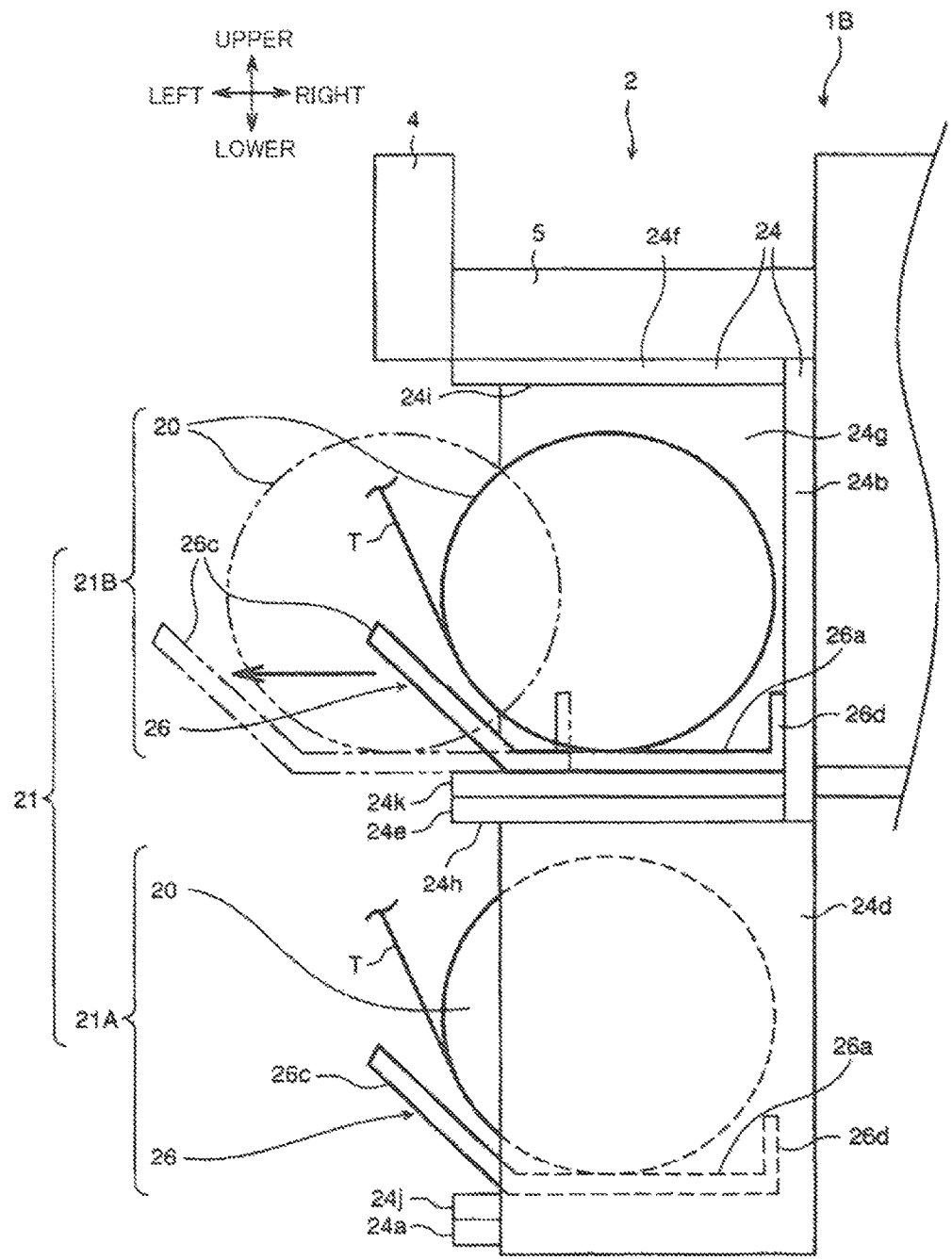
FIG. 6 is a diagram showing a second modification of the component supply device according to the present disclosure, and an enlarged schematic front elevational view of a principal portion showing a reel holding portion.

FIG. 6 is a diagram showing a second modification of the component supply device according to the present disclosure, and a schematic enlarged front elevational view of a principal portion showing a reel holding portion.

The reel holding portion 21 described in the aforementioned embodiment may be that rendering trays 26 introducible/dischargeable by sliding the same in the horizontal direction with respect to a lower stage side tape storage portion 21A and an upper stage side tape storage portion 21B, as in a component supply device 1B shown in FIG. 6.

In this case, receiving portions 26c receiving reels 20, levers 26c continuously provided on sides of these receiving portions 26a closer to openings 24h and 24i and stoppers 26d bent/formed upward from inner side end portions of the receiving portions 26a are integrally formed on the respective trays 26. Lower surfaces of the receiving portions 26a are preferably formed to be easily slidable with respect to tray sliders 24j and 24k arranged on lower sides thereof.

The levers 26c are regions grasped by the operator when he/she draws or thrusts the trays 26 from or into the lower stage side tape storage portion 21A and the upper stage side tape storage portion 21B. These levers 26c are bent/formed at angles obtuse with respect to the receiving portions 26a in side elevational view, for example, to also accomplish functions of inhibiting the reels 20 placed on the receiving portions 26a from dropping out of the receiving portions 26a toward outer sides of the openings 24h and 24j.

The reel holding portion 21 is brought into the same structure as the reel holding portion 21 of the aforementioned first modification or a structure obtained by arranging the tray sliders 24*j* and 24*k* on the lower surfaces of the trays 26. The tray sliders 24*j* and 24*k* are plate members receiving the trays 26, and provided on lower surface members 24*a* and 24*e*. In this case, the tray sliders 24*j* and 24*k* may be those fixed onto the lower surface members 24*a* and 24*e* as shown in FIG. 6, or may be those made to slide on the lower surface members 24*a* and 24*e* along with the trays 26.

Thus, the reel holding portion 21 is provided with the introducible/dischargeable sliding trays 26, whereby the reels 20 can be easily placed on the trays 26 due to drawing-out of the trays 26 in a case where the operator draws out the trays 26, as shown by phantom lines in FIG. 6.

When the operator thrusts the trays 26 into the lower stage side tape storage portion 21A and the upper stage side tape storage portion 21B as shown by solid lines in FIG. 6, the levers 26*c* are so arranged on front surfaces of the openings 24*h* and 24*i* that the same can inhibit the reels 20 from dropping out of the trays 26 also at a time component supply tapes T wound on the reels 20 are pulled and unwound, whereby operation efficiency can be improved.

Third Modification

Figure 7A:
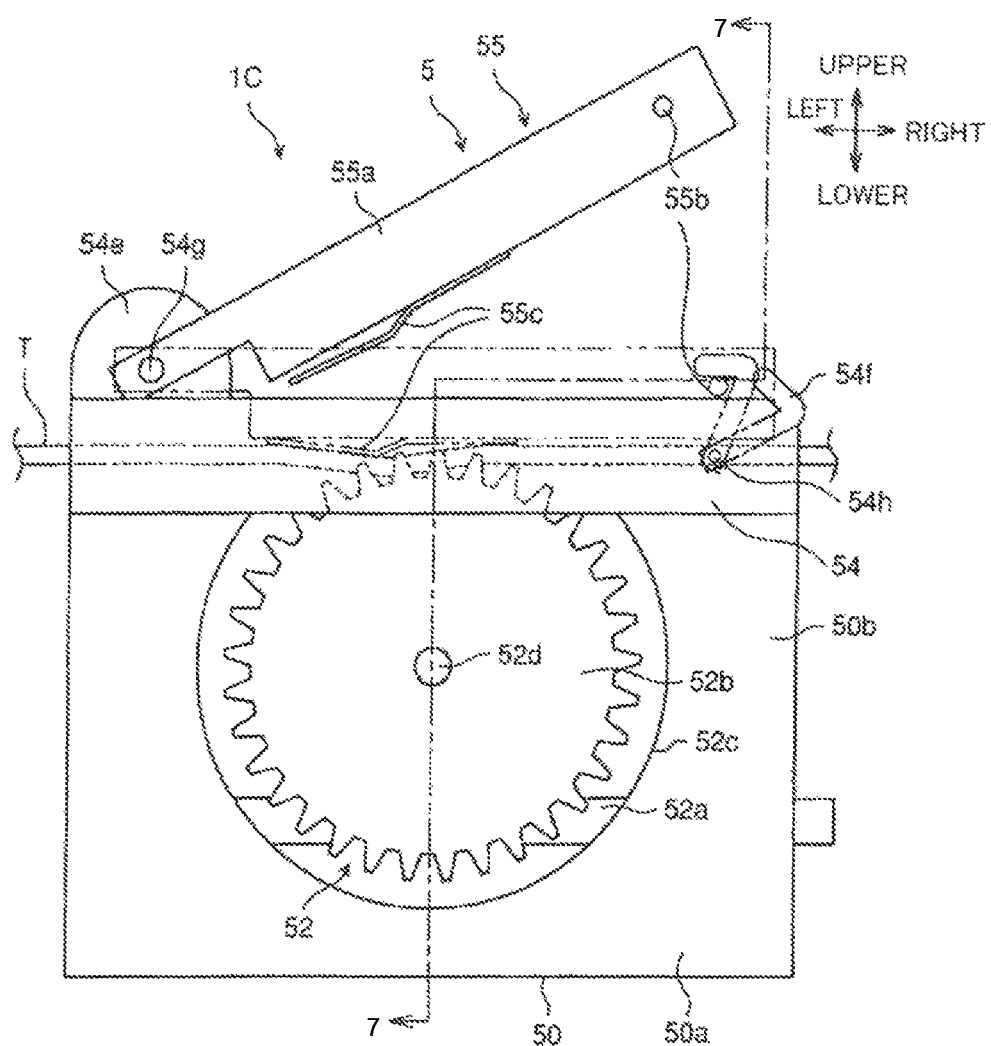
FIG. 7A is a diagram showing a third modification of the component supply device according to the present disclosure, and an enlarged schematic front elevational view of a principal portion showing a standby portion.

FIGS. 7A and 7B are diagrams showing a third modification of the component supply device according to the present disclosure, FIG. 7A is an enlarged schematic front elevational view of a principal portion showing a standby portion, and FIG. 7B is a sectional view in an arrow-line 7-7 direction in FIG. 7A.

The lid member 53 (see FIGS. 3A and 3B) of the standby portion 5 of the component supply device 1 described in the aforementioned embodiment may be pivotally supported with respect to a transportation path 54 so as to be pivotable in the vertical direction, as a lid member 55 of a component supply device 1C shown in FIGS. 7A and 7B.

In this case, the transportation path 54 mainly includes a guide groove 54*a*, sidewalls 54*b*, a gear insertion groove 54*a*, a pivotal support section 54*e*, a lock member 54*f* and a pivotal support member 54*g* described later respectively.

The guide groove 54*a* is provided substantially in the form of a recess portion in side elevational view, similarly to the aforementioned embodiment.

As to the pair of sidewalls 54*b*, the lock member 54*f* is arranged on one side (sidewall on the front side) and the pivotal support section 54*e* is provided on the other side (sidewall on the rear side), for example.

The gear insertion groove 54*d* has the same structure as the gear insertion groove 51*d* of the aforementioned embodiment.

The pivotal support section 54*a* is a platelike member having a pivotal support member 54*g* pivotally supporting a left-side end portion of the lid member 55 to be pivotable in the vertical direction, and protruded from an upper end of the left-side end portion of the sidewall 54*b* to be directed upward, as shown in FIGS. 7A and 7B.

The lock member 54*f* is a hooklike member stopped by a stop pin 55*b* in a state pressing a plate spring 55*c* against a component supply tape T for holding the lid member 55 in a state blocking the guide groove 54*a*. The lock member 54*f* consists of a member substantially L-shaped in front elevational view, and a base end portion is pivotally supported on the sidewall 54*b* by a support shaft 54*h*.

The lid member 55 mainly includes a lid member body 55*a*, the stop pin 55*b* and a plate spring 55*c*, similarly to the lid member of the aforementioned embodiment.

A left end portion of the lid member body 55*a* is arranged on the transportation path 54 by the pivotal support member 54*g*, to be pivotable in the vertical direction.

The stop pin 55*b* is protruded in front of a right-side end portion of the lid member body 55*a*.

The plate spring 55*c* is set on a position of a lower surface of the lid member body 55*a* slightly closer to the pivotal support member 54*g*, to be capable of pressing a component supply tape Tb in the vicinity of the pivotal support member 54*g*.

Thus, the standby portion 5 can pivot the lid member 55 on the pivotal support member 54*g* in the vertical direction with respect to the transportation path 54, whereby the component supply tape Tb to be replenished arranged between the transportation path 54 and the lid member 55 is rendered attachable/detachable to/from the standby portion 5.

While various modes such as an open/close type one shown in FIG. 7A, the complete separation type lid member 53 (see FIGS. 3A and 3B) as in the aforementioned embodiment etc. are conceivable as to the lid member 55, it is anyway important to bring the same into a structure of only the sidewalls 54*b* of the transportation path 54 on side surfaces of the component supply tape T, whereby the whole standby portion 5 can be compacted by reducing the full width of the standby portion 5.

Fourth Modification

FIGS. 8A and 8B are diagrams showing a fourth modification of the component supply device according to the present disclosure, FIG. 8A is an enlarged schematic front elevational view of a principal portion showing a standby portion, and FIG. 8B is a sectional view in an arrow-line 8-8 direction in FIG. 8A.

The standby portion 5 of the component supply device described in the aforementioned embodiment may be that prepared by arranging and integrating two standby portions 5A and 5B adjacently in the anteroposterior direction, as in a component supply device 1D shown in FIGS. 8A and 8B.

In this case, lengths of the respective ones of a base 56, a pivotal support member 57*d* of a transportation mechanism 57 and a transportation path 58 in the anteroposterior direction are formed in lengths matched with lengths of the respective ones of the two standby portions 5A and 5B in the anteroposterior direction.

In other words, the base 56 is formed in a length of about twice the length of the base 50*a* (see FIGS. 3A and 3B) in the anteroposterior direction in the aforementioned embodiment.

The length of the pivotal support member 57*d* in the anteroposterior direction is also formed in a length of about twice that of the pivotal support member 52*d* (see FIGS. 3A and 3B) in the aforementioned embodiment, to be capable of supporting two transmission gears 57*b* and transportation gears 57*c* on a sidewall 56*b* with one member.

The transportation path 58 also includes two guide grooves 58*a* into which two component supply tapes T and the two standby portions 5A and 5B are slidably engageable respectively, and is so formed that the length in the anteroposterior direction is matched with a value twice that of the transportation path 51 (see FIGS. 3A and 3B) in the aforementioned embodiment.

Thus, the component supply device 1 prepared by integrating a plurality of standby portions 5 with each other has the standby portion 5 prepared by lining up the two standby portions 5A and 5B and adjacently integrating the same with each other to be capable of simultaneously supplying two component supply tapes T to a component mounting device 7 while putting two replenished component supply tapes Tb on standby, whereby the same can be applied also to a dual type component supply device supplying two types of tapes in one device.

In order to prevent stoppage of the component mounting device 7 following exhaustion, it is necessary to replenish a replenished component supply tape Tb as to each tape type.

Fifth Modification

Figure 9A:
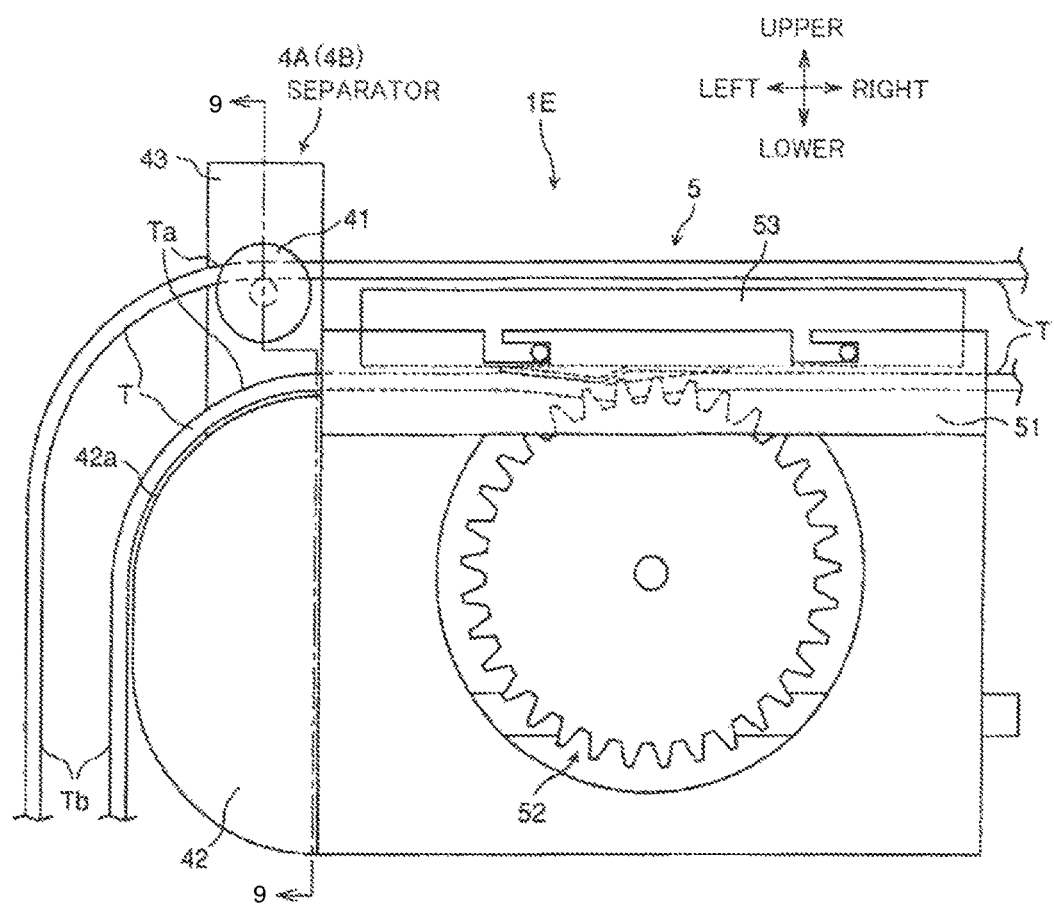
FIG. 9A is a diagram showing a fifth modification of the component supply device according to the present disclosure, and an enlarged schematic front elevational view of a principal portion showing a separator.

FIGS. 9A and 9B are diagrams showing a fifth modification of the component supply device according to the present disclosure, FIG. 9A is an enlarged schematic front elevational view of a principal portion showing a separator, and FIG. 9B is a sectional view in an arrow-line 9-9 direction in FIG. 9A.

The separator 4 of the component supply device 1 described in the aforementioned embodiment may be that prepared by arranging and integrating two separators 4A and 4B to be adjacent to each other in the anteroposterior direction, as separators 4A and 4B of a component supply device 1E shown in FIGS. 9A and 9B.

In this case, a device provided with the two separators 4A and 4B integrated to be adjacent to each other while integrating the two standby portions 5A and 5B described in the aforementioned fourth modification correspondingly thereto is used for the component supply device 1E. The separators 4A and 4B are prepared by sharing the upright plate 43 of the separator 4 (see FIGS. 2A and 2B) described in the aforementioned embodiment by two units, and configured to be anteroposteriorly symmetrical with respect to the upright plate 43.

Thus, the two separators 4A and 4B share one upright plate 43 when combining and integrating the two units of the separators 4A and 4B with each other, whereby compactification can be attained by reducing the width of the whole device in the anteroposterior direction due to the sharing, as compared with a case of simply combining the separators 4A and 4B with each other.

Sixth Modification

A sixth modification is now described. A confluent portion 1004 which is a portion where a channel 1001 for the component supply tape Ta and a channel 1002 for the component supply tape Tb join with each other is present between the standby portion 5 and the sensor S of the component supply device 1 of FIGS. 1A and 1B (more specifically, also expressible as between the standby portion 5 and the lid member 53 or at a terminal end of the lid member 53). In this confluent portion 1004, there is also a case where at least one of the component supply tape Ta and the component supply tape Tb is bent (also expressible as buckled) when supplied. This modification takes this buckling into consideration.

Figure 13:
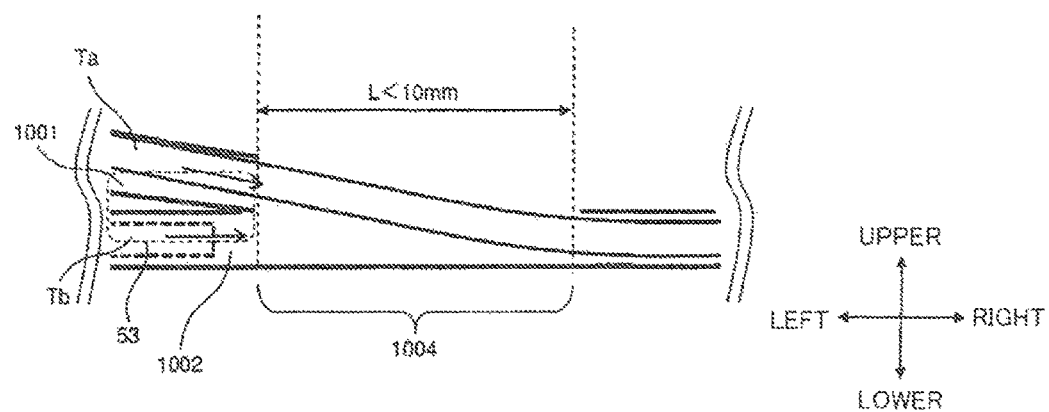
FIG. 13 is a diagram illustrating a sixth modification.

FIG. 13 is a diagram illustrating this modification, and a diagram illustrating the periphery of the confluent portion 1004. The confluent portion 1004 is also expressible as an opening formed above a channel of the component supply device 1. According to this modification, this confluent portion 1004 is so configured that a length L thereof is minimized, to be smaller than 10 mm, for example. Thus, it becomes possible to suppress buckling.

Seventh Modification

Figure 14:
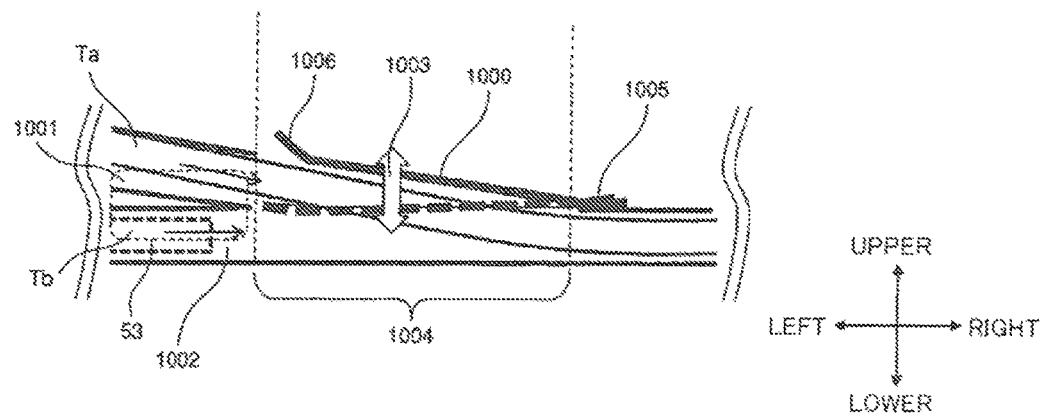
FIG. 14 is a diagram illustrating a seventh modification.

A seventh modification is now described. This modification suppresses buckling by a method different from that of the sixth modification. FIG. 14 shows a diagram illustrating this modification. According to this modification, a buckling prevention mechanism 1000 is arranged on a confluent portion 1004. The buckling prevention mechanism 1000 is such a plate spring that one end portion thereof is fixed to a component supply device 1 with a screw 1005. Aluminum, SUS, copper or the like is conceivable as the material for the buckling prevention mechanism 1000. Further, the buckling prevention mechanism 1000 moves in the vertical direction about a portion fixed by the screw 1005, while the same has an inclined portion 1006 inclined upward, not to block the confluent portion 1004 at this time.

An operation of the buckling prevention mechanism 1000 is described. The buckling prevention mechanism 1000 is in a state parallel in the horizontal direction as shown by a dotted line, in a state where a component supply tape Ta is not transported through a channel 1001. When the component supply tape Tb is transported to the confluent portion 1004 through a channel 1002 in this state, the buckling prevention mechanism 1000 prevents the component supply tape Tb from buckling when the same is transported by blocking an opening formed in an upper portion of the channel.

The buckling prevention mechanism 1000 enters a state shown by a solid line in a state where the same is lifted up by the operator and the component supply tape Ta is transported through the channel 1001. Thereafter the operator newly sets the component supply tape Tb, and the component supply tape Tb repeats being transported by the buckling prevention mechanism 1000 without bucking after the component supply tape Ta is exhausted.

As hereinabove described, the buckling prevention mechanism 1000 moves about the portion fixed by the screw 1005 in a direction of arrow 1003 and prevents buckling. According to this modification, buckling is suppressed by the bucking prevention mechanism 1000.

Eighth Modification

An eighth modification is now described. This modification relates to stop grooves 51c. While the stop grooves 51c are formed on the sidewalls 51b as described above, a plurality of regions for inserting a stop pin 53b are provided on each of these stop grooves 51c according to this modification. According to this modification, further, each stop groove 51c is so formed that the lengths of the plurality of regions are different from each other.

Figure 15A:
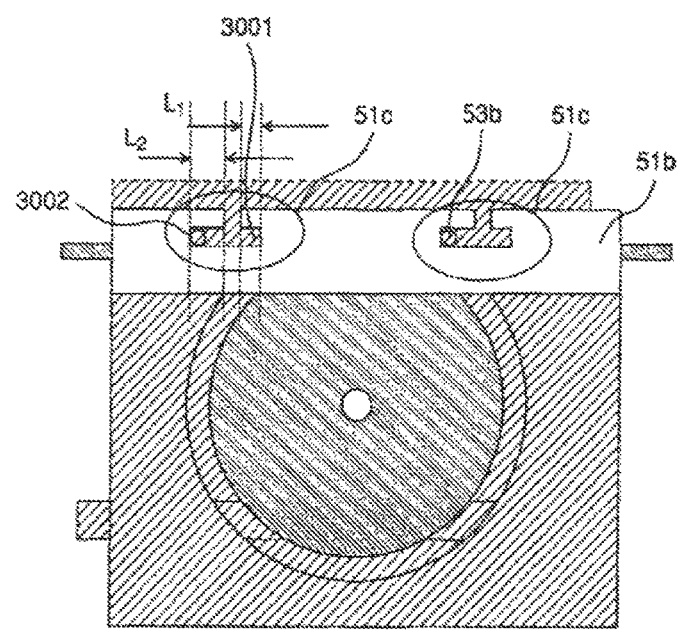
FIG. 15A is a diagram illustrating an eighth modification, and a diagram showing a state of forming regions of each stop groove at the same height in opposite directions.
Figure 15B:
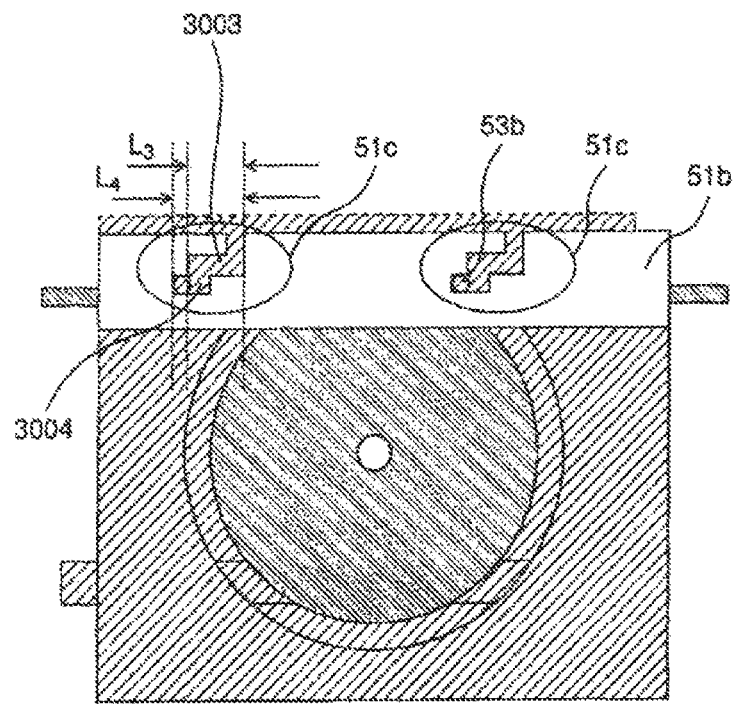
FIG. 15B is a diagram illustrating the eighth modification, and a diagram showing a state of forming regions of each stop groove at different heights in the same direction.

FIGS. 15A and 15B are diagrams illustrating this modification. Referring to FIG. 15A, a region 3001 and a region 3002 of each stop groove 51c are formed at the same height in opposite directions. Assuming that $L_1$ represents the length of the region 3001 and $L_2$ represents the length of the region 3002, the relation $L_1<L_2$ holds in this modification (may be $L_1=L_2$). It follows that the stop pin 53b is inserted into either the region 3001 or the region 3002.

Referring to FIG. 15B, a region 3003 and a region 3004 of each stop groove 51c are formed at different heights in the same direction. Assuming that $L_3$ represents the length of the region 3003 and $L_4$ represents the length of the region 3004, the relation $L_3<L_4$ holds in this modification. It follows that the stop pin 53b is inserted into either the region 3003 or the region 3004.

In either case, it becomes possible to change a place where a lid member 53 is stopped by the stop pin 53b, i.e., to change the position of a plate spring 53c. According to this structure, transportation force can be changed by changing a joint state of a component supply tape T and a transportation gear by increasing/decreasing force for pressing the component supply tape T against the transportation gear.

Ninth Modification

A ninth modification is now described. This modification also relates to a stop groove 51c.

Figure 16:
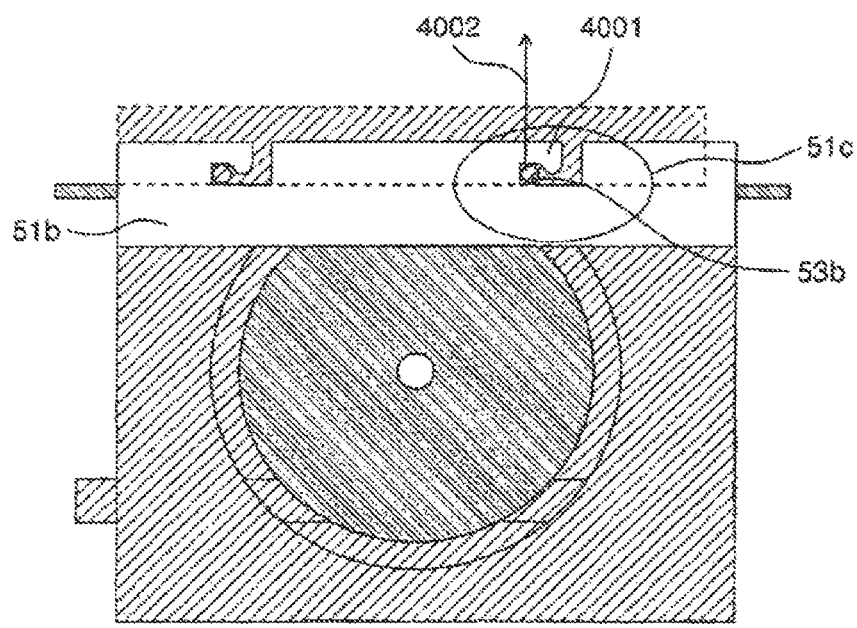
FIG. 16 is a diagram illustrating a ninth modification.

FIG. 16 is a diagram illustrating this modification. Such a case is also conceivable that a stop pin 53b moves when a disturbance such as vibration is applied to a component supply device 1 and a lid member 53 also moves as a result. According to this modification, therefore, a return 4001 (also expressible as a rib or a portion thicker than other portions) is formed on the stop groove 51c. Thus, it follows that the stop pin 53b receives an acting force in a direction of arrow 4002, whereby it becomes possible for the stop pin 53b to strongly hold the position thereof.

Tenth Modification

Figure 17A:
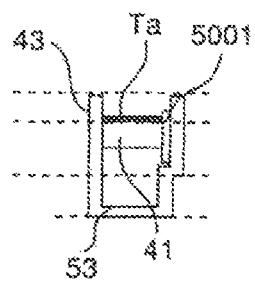
FIG. 17A is a diagram illustrating a tenth modification, and a sectional view illustrating a lid member from a left direction.
Figure 17B:
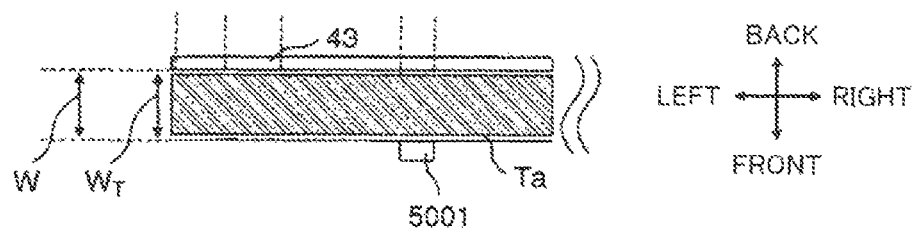
FIG. 17B is a diagram illustrating the tenth modification, and a top plan view illustrating the lid member from above.
Figure 17C:
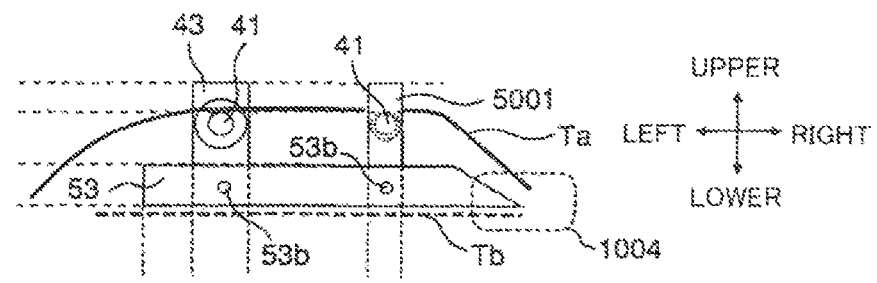
FIG. 17C is a diagram illustrating the tenth modification, and a side elevational view illustrating the lid member from the front direction.

A tenth modification is now described. This modification takes into consideration that a component supply tape deviates from a path where the same must be originally transported (also expressible as meandering). FIGS. 17A to 17C are diagrams illustrating this modification. FIG. 17A is a sectional view illustrating a lid member 53 in this modification from a left direction, FIG. 17B is a top plan view illustrating the lid member 53 in this modification from above, and FIG. 17C is a side elevational view illustrating the lid member 53 in this modification from the front-side direction. As shown in FIG. 17A, an upright plate 43 and the lid member 53 in this modification are integrally molded. The aforementioned tape holding portion 41 is arranged on the upright plate 43.

According to this modification, a guide 5001 for preventing meandering of a preceding component supply tape Ta is formed on a channel (also expressible as a space between the upright plate 43 and a confluent portion 1004) at the back of the aforementioned upright plate 43, as shown in FIGS. 17B and 17C. While the guide 5001 and the lid member 53 are integrally molded as shown in FIG. 17A, a structure obtained by preparing the guide 5001 and the lid member 53 independently of each other respectively and thereafter connecting the same with each other may be employed. According to this modification, the lid member 53 has a section of a substantially U shape (also expressible as an upwardly recessed shape) as shown in FIG. 17A, and it follows that the upright plate 43 and the guide 5001 have U-shaped side surfaces. According to this modification, the guide 5001 is arranged on a position different from that of the upright plate 43 in the horizontal direction, and different therefrom also in the front-rear direction, as shown in FIGS. 17B and 17C. There is also a case where the aforementioned tape holding portion 41 is arranged also on the guide 5001.

According to this modification, it follows that a preceding component supply tape Ta is held by the upright plate 43 and the guide 5001 as shown in FIG. 17B, and it follows that the same is inhibited from meandering in the front-rear direction. As to a width W of the lid member 53 and a width $W_1$ of the preceding component supply tape Ta, W is slightly larger according to this modification, and it follows that the upright plate 43 and the guide 5001 are arranged with widths allowing passage of the preceding component supply tape Ta.

Further, while the height of the tape holding portion 41 of the upright plate 43 and the height of the tape holding plate 41 of the guide 5001 are the same height according to this modification, there is also a case where an angle at which the preceding component supply tape Ta is transported to the confluent portion 1004 is defined by relative positional relation between the tape holding portion 41 of the upright plate 43 and the tape holding portion 41 of the guide 5001, and hence a technique of configuring the height of the tape holding portion 41 of the upright plate 43 and the height of the tape holding plate 41 of the guide 5001 to be different from each other and a technique of employing a structure including no tape holding portion 41 on the guide 5001 as the case may be are also within the range of disclosure of this description.

Figure 18:
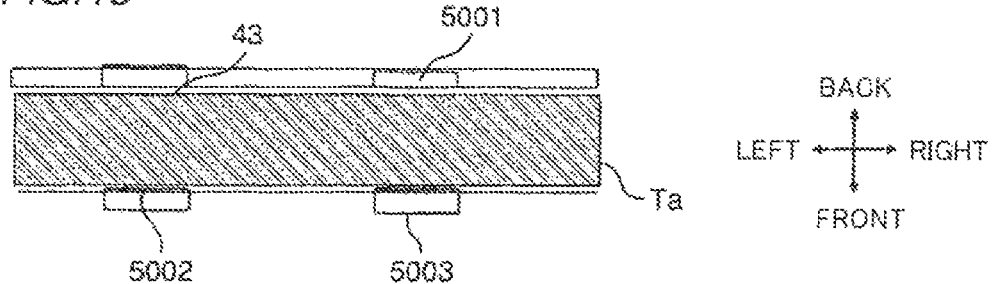
FIG. 18 is a diagram illustrating an eleventh modification.

Further, a technique of arranging a guide 5002 to be opposed to an upright plate 43 in addition to a guide 5001 and also arranging a guide 5003 and the guide 5001 to be opposed to each other as shown in FIG. 18 is also in the range of the disclosure of this specification.

Other Modifications

In the standby portion 5 (see FIGS. 3A, 3B, 7A, 7B, 8A and 8B) described with reference to each of the aforementioned embodiments, in the third modification and the fourth modification, driving force is transmitted from a driving force transmission system to the transportation mechanism 52 for the component supply tapes T to move the component supply tapes T to the component supply device 1 when the preceding component supply tape Ta is exhausted, while transportation resistance resulting from friction or the like of the component supply tapes T is dispersed and hence dispersion is caused in a traveling speed.

When the traveling speed with the replenishing unit 2 is larger than a receiving speed of the component supply device 1, there is an apprehension of causing deformation such as buckling on surplus portions of the component supply tapes T resulting from speed difference, and it follows that tension takes place on the component supply tapes T between the component supply device 1 and the replenishing unit 2 due to the speed difference when the traveling speed is smaller than the receiving speed of the component supply device 1.

As a method of solving these problems, a one-way clutch is so provided on the transportation mechanism 52 of the standby portion 5 that the component supply tapes T can be inhibited from deformation or occurrence of tension on the component supply tape T can be suppressed even if the traveling speed is dispersed due to the replenishing unit 2. In this case, it is effective to regularly provide a speed difference of the transportation speed for the component supply tapes T smaller than the receiving speed of the component supply device 1.

As another solving method, the problems can also be solved by performing speed control so that the traveling speed with the replenishing unit 2 is equivalent to the receiving speed of the component supply device 1.

What is claimed is:

1. A component supply device comprising:
    a replenishing unit performing replenishment of a new component supply tape when a preceding component supply tape is exhausted and a sensor sensing exhaustion of the preceding component supply tape, wherein the replenishing unit includes a separator spacing the new component supply tape apart from the preceding component supply tape,
    a confluent portion where a channel for the preceding component supply tape and a channel for the new component supply tape join with each other is formed between the sensor and the replenishing unit, and a buckling prevention mechanism preventing buckling of at least one of the preceding component supply tape and the new component supply tape is arranged on the confluent portion.

2. The component supply device according to claim 1, further comprising a standby portion putting the new component supply tape on standby, wherein the standby portion has:

a transportation path having a guide groove formed in a size corresponding to a width of the new component supply tape so that the new component supply tape is movably inserted thereinto, and a lid member arranged in the guide groove through the new component supply tape, sidewalls are present on both sides of the guide groove, stop grooves are formed on the sidewalls, and the stop grooves have a plurality of regions for stopping the lid member.

3. The component supply device according to claim 2, wherein the lid member has pins for stopping the lid member to the stop grooves, and the stop grooves have returns for fixing the pins.

4. The component supply device according to claim 3, wherein the replenishing unit includes:

a reel holding portion into which a reel wound with the new component supply tape is inserted, and a standby portion for the new component supply tape, for moving the new component supply tape from the standby portion and replenishing the preceding component supply tape when the sensor senses the exhaustion of the preceding component supply tape and a sensing signal is generated.

5. The component supply device according to claim 4, wherein the replenishing unit includes a separator separating the preceding component supply tape and a replenished component supply tape from each other in addition to the reel holding portion and the new component supply tape, for putting the replenished component supply tape on standby in a state positionally deviating from the preceding component supply tape in the vertical direction in the replenishing unit.

6. The component supply device according to claim 5, having:

a feeder feeding the new component supply tape, and a transportation mechanism driving the feeder, wherein the lid member is attachably/detachably provided on the transportation path, and the transportation mechanism is arranged on a part of the transportation path to be in contact with the new component supply tape, and the new component supply tape is moved by rotation/driving of the feeder.

7. The component supply device according to claim 6, wherein the feeder includes a one-way clutch, and the feeder is so rotated/driven that a traveling speed of the new component supply tape with the feeder is smaller than a receiving speed of the component supply device.

8. The component supply device according to claim 6, wherein the feeder rotates so that a traveling speed of the new component supply tape is identical to a receiving speed of the component supply device.

9. The component supply device according to claim 8, wherein the reel holding portion includes a box-shaped tape storage portion arranged in a plurality of stages in the vertical direction and having an opening opened in a transverse direction, and the tape storage portion is provided with:

a tray pivotably or slidably arranged in the tape storage portion so that the reel is placed thereon, and a lever for pivoting or sliding the tray.

10. The component supply device according to claim 1, wherein the buckling prevention mechanism moves in response to an operation of at least either the preceding component supply tape or the new component supply tape.

11. The component supply device according to claim 1, having:

a standby portion putting the new component supply tape on standby, wherein the standby portion has:

a transportation path having a guide groove formed in a size corresponding to a width of the new component supply tape so that the new component supply tape is movably inserted thereinto, and a lid member arranged in the guide groove through the new component supply tape, sidewalls are present on both sides of the guide groove, stop grooves are formed on the sidewalls, and the stop grooves have a plurality of regions for stopping the lid member.

12. The component supply device according to claim 11, wherein the standby portion has:

a transportation path having a guide groove formed in a size corresponding to the width of the new component supply tape so that the component supply tape is movably inserted thereinto, a lid member arranged in the guide groove through the new component supply tape, a feeder feeding the new component supply tape, and a transportation mechanism driving the feeder, the lid member is attachably/detachably provided on the transportation path, the transportation mechanism is arranged on a part of the transportation path to be in contact with the component supply path, and the new component supply tape is moved by rotation/driving of the feeder.

13. The component supply device according to claim 12, wherein the feeder includes a one-way clutch, and the feeder is so rotated/driven that a traveling speed of the new component supply tape with the feeder is smaller than a receiving speed of the component supply device.

14. The component supply device according to claim 12, wherein the feeder rotates so that a traveling speed of the new component supply tape is identical to a receiving speed of the component supply device.

15. The component supply device according to claim 14, wherein the reel holding portion includes a box-shaped tape storage portion arranged in a plurality of stages in the vertical direction and having an opening opened in a transverse direction, and the tape storage portion is provided with:

a tray pivotably or slidably arranged in the tape storage portion so that the reel is placed thereon, and a lever for pivoting or sliding the tray.

16. The component supply device according to claim 1, having:
- a standby portion putting the new component supply tape on standby, wherein
- the standby portion has:
- a transportation path having a guide groove formed in a size corresponding to a width of the new component supply tape so that the new component supply tape is movably inserted thereinto, and
- a lid member arranged in the guide groove through the new component supply tape,
- sidewalls are present on both sides of the guide groove,
- stop grooves are formed on the sidewalls,
- the lid member has pins for stopping the lid member on the stop grooves, and
- the stop grooves have returns for fixing the pins.

17. The component supply device according to claim 1, wherein
- the replenishing unit includes:
- a reel holding portion into which a reel wound with the new component supply tape is inserted, and
- a standby portion for the new component supply tape,
- for moving the new component supply tape from the standby portion and replenishing the new component supply tape when the sensor senses the exhaustion of the preceding component supply tape and a sensing signal is generated.

18. The component supply device according to claim 17, wherein
- the replenishing unit includes a separator separating the preceding supply tape and a replenished component supply tape from each other in addition to the reel holding portion and the new component supply tape,
- for putting the replenished component supply tape on standby in a state positionally deviating from the preceding component supply tape in the vertical direction in the replenishing unit.

19. A component mounting device comprising
a component supply device, wherein
the component supply device includes:
- a replenishing unit performing replenishment of a new component supply tape when a preceding component supply tape is exhausted, the replenishing unit includes a separator spacing the new component supply tape apart from the preceding component supply tape, and
- a sensor sensing exhaustion of the preceding component supply tape,
- a confluent portion where a channel for the preceding component supply tape and a channel for the new component supply tape join with each other is formed between the sensor and the replenishing unit, and
- a buckling prevention mechanism preventing buckling of at least one of the preceding component supply tape and the new component supply tape, the buckling prevention mechanism being arranged on the confluent portion.

20. The component mounting device according to claim 19,
further comprising a standby portion putting the new component supply tape on standby, wherein
the standby portion has:
- a transportation path having a guide groove formed in a size corresponding to a width of the new component supply tape so that the new component supply tape is movably inserted thereinto, and
- a lid member arranged in the guide groove through the new component supply tape,
- sidewalls are present on both sides of the guide groove,
- stop grooves are formed on the sidewalls, and
- the stop grooves have a plurality of regions for stopping the lid member.

* * * * *